(12) United States Patent
Burak et al.

(10) Patent No.: US 9,608,594 B2
(45) Date of Patent: Mar. 28, 2017

(54) CAPACITIVE COUPLED RESONATOR DEVICE WITH AIR-GAP SEPARATING ELECTRODE AND PIEZOELECTRIC LAYER

(71) Applicant: Avago Technologies General IP (Singapore) Pte. Ltd., Singapore (SG)

(72) Inventors: Dariusz Burak, Fort Collins, CO (US); Phil Nikkel, Loveland, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 41 days.

(21) Appl. No.: 14/290,777

(22) Filed: May 29, 2014

(65) Prior Publication Data

US 2015/0349747 A1 Dec. 3, 2015

(51) Int. Cl.
*H03H 9/54* (2006.01)
*H03H 9/02* (2006.01)
*H03H 9/17* (2006.01)
*H03H 9/13* (2006.01)

(52) U.S. Cl.
CPC .......... *H03H 9/54* (2013.01); *H03H 9/02157* (2013.01); *H03H 9/13* (2013.01); *H03H 9/173* (2013.01); *H03H 9/02118* (2013.01); *H03H 9/177* (2013.01)

(58) Field of Classification Search
CPC .......... H03H 9/173; H03H 9/54; H03H 9/542; H03H 9/177; H03H 9/02157; H03H 9/02118; H03H 9/13; H03H 9/132
USPC .......................................... 333/133, 186–188
See application file for complete search history.

(56) References Cited

U.S. PATENT DOCUMENTS

| | | |
|---|---|---|
| 5,587,620 A | 12/1996 | Ruby et al. |
| 5,617,065 A * | 4/1997 | Dydyk ..................... H03H 3/04 310/321 |
| 5,873,153 A | 2/1999 | Ruby et al. |
| 6,107,721 A | 8/2000 | Lakin |
| 6,204,737 B1 * | 3/2001 | Ella .......................... H01P 1/127 310/321 |
| 6,384,697 B1 | 5/2002 | Ruby |
| 6,507,983 B1 | 1/2003 | Ruby et al. |
| 6,548,943 B2 | 4/2003 | Kaitila et al. |
| 6,635,519 B2 | 10/2003 | Barber et al. |
| 7,275,292 B2 | 10/2007 | Ruby et al. |
| 7,280,007 B2 | 10/2007 | Feng et al. |
| 7,345,410 B2 | 3/2008 | Grannen et al. |
| 7,358,831 B2 | 4/2008 | Larson, III et al. |
| 7,372,346 B2 * | 5/2008 | Tilmans ............. H03H 9/02102 333/187 |
| 7,388,454 B2 | 6/2008 | Ruby et al. |
| 7,629,865 B2 | 12/2009 | Ruby |

(Continued)

OTHER PUBLICATIONS

Co-pending U.S. Appl. No. 13/955,774, filed Jul. 31, 2013.

(Continued)

*Primary Examiner* — Barbara Summons
*Assistant Examiner* — Jorge Salazar, Jr.

(57) ABSTRACT

A bulk acoustic wave (BAW) resonator includes a bottom electrode disposed on a substrate, a piezoelectric layer disposed over the bottom electrode, and a top electrode disposed over the piezoelectric layer. The BAW resonator further includes at least one air-gap and corresponding support structure, where the at least one air-gap separates at least one of the bottom electrode and the top electrode from the piezoelectric layer, respectively.

17 Claims, 11 Drawing Sheets

(56) References Cited

U.S. PATENT DOCUMENTS

| | | | |
|---|---|---|---|
| 2005/0012571 A1* | 1/2005 | Song | H03H 3/02 333/192 |
| 2007/0205850 A1 | 9/2007 | Jamneala et al. | |
| 2008/0111651 A1* | 5/2008 | Isobe | H03H 3/02 333/187 |
| 2008/0258842 A1 | 10/2008 | Ruby et al. | |
| 2010/0327697 A1 | 12/2010 | Choy et al. | |
| 2010/0327994 A1 | 12/2010 | Choy et al. | |
| 2012/0050236 A1 | 3/2012 | Lo et al. | |
| 2012/0218057 A1 | 8/2012 | Burak et al. | |
| 2013/0106534 A1 | 5/2013 | Burak et al. | |
| 2013/0140958 A1 | 6/2013 | Chen et al. | |
| 2013/0235001 A1 | 9/2013 | Yun et al. | |
| 2014/0118088 A1 | 5/2014 | Burak et al. | |
| 2014/0118091 A1 | 5/2014 | Burak et al. | |

OTHER PUBLICATIONS

Co-pending U.S. Appl. No. 13/662,425, filed Oct. 27, 2012.
Co-pending U.S. Appl. No. 13/662,460, filed Oct. 27, 2012.
Co-pending U.S. Appl. No. 14/192,599, filed Feb. 27, 2014.
Co-pending U.S. Appl. No. 13/658,024, filed Oct. 23, 2012.
Co-pending U.S. Appl. No. 13/654,718, filed Oct. 18, 2012.
Co-pending U.S. Appl. No. 13/781,491, filed Feb. 28, 2013.
Co-pending U.S. Appl. No. 14/225,710, filed Mar. 26, 2014.
Antonio Qualtieri et al., "Nonclassical emission from single colloidal nanocrystals in a microcavity: a route towards room temperature single photon sources", New J. Phys. 11 (2009) 033025, pp. 1-5.
Office Action dated Oct. 7, 2016 for U.S. Appl. No. 14/954,269.

* cited by examiner

CAPACITIVE COUPLED RESONATOR DEVICE WITH AIR-GAP SEPARATING ELECTRODE AND PIEZOELECTRIC LAYER

BACKGROUND

Acoustic resonators can be used to implement signal processing functions in various electronic applications. For example, some cellular phones and other communication devices use acoustic resonators to implement frequency filters for transmitted and/or received signals. Several different types of acoustic resonators can be used according to different applications, with examples including bulk acoustic wave (BAW) resonators such as thin film bulk acoustic resonators (FBARs), coupled resonator filters (CRFs), stacked bulk acoustic resonators (SBARs), double bulk acoustic resonators (DBARs), Laterally Coupled Resonators Filters (LCRFs), and solidly mounted resonators (SMRs). An FBAR, for example, includes a piezoelectric layer between a bottom (first) electrode and a top (second) electrode over a cavity. BAW resonators may be used in a wide variety of electronic applications and devices, such as cellular telephones, personal digital assistants (PDAs), electronic gaming devices, laptop computers and other portable communications devices. For example, FBARs operating at frequencies close to their fundamental resonance frequencies may be used as a key component of radio frequency (RF) filters and duplexers in mobile devices.

An acoustic resonator typically comprises a layer of piezoelectric material applied to a top surface of a bottom electrode, and a top plate electrode applied to a top surface of the piezoelectric material, resulting in a structure referred to as an acoustic stack. Where an input electrical signal is applied between the electrodes, reciprocal or inverse piezoelectric effect causes the acoustic stack to mechanically expand or contract depending on the polarization of the piezoelectric material. As the input electrical signal varies over time, expansion and contraction of the acoustic stack produces acoustic waves that propagate through the acoustic resonator in various directions and are converted into an output electrical signal by the piezoelectric effect. Some of the acoustic waves achieve resonance across the acoustic stack, with the resonant frequency being determined by factors such as the materials, dimensions, and operating conditions of the acoustic stack. These and other mechanical characteristics of the acoustic resonator determine its frequency response.

Generally, a conventional FBAR designed to operate at approximately 3.6 GHz, for example, would have approximately 1800 Å thick top and bottom electrodes formed of tungsten (W), and an approximately 2600 Å thick piezoelectric layer for of aluminum nitride (AlN). The thickness of the piezoelectric layer is predominantly determined by the desired frequency of operation, but also by the desired electromechanical coupling coefficient $Kt^2$. Within applicable limits, the electromechanical coupling coefficient $Kt^2$ is proportional to thickness of the piezoelectric layer and inversely proportional to thicknesses of bottom and top electrodes. More specifically, the electromechanical coupling coefficient $Kt^2$ is proportional to the fraction of acoustic energy stored in the piezoelectric layer and inversely proportional to the fraction of acoustic energy stored in the electrodes. This design, requiring a reasonable electromechanical coupling coefficient $Kt^2$ (e.g., approximately 5.5 percent), has a number of problems operating at high frequencies (e.g., greater than or equal to about 3.5 GHz). For example, such an FBAR would be susceptible to electrostatic discharge (ESD) failures due to large electric fields, low-power failures due to small area, large perimeter-to-area loss due to small device area, and large series resistance Rs due to the presence of relatively thin metal top and bottom electrodes.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1A:
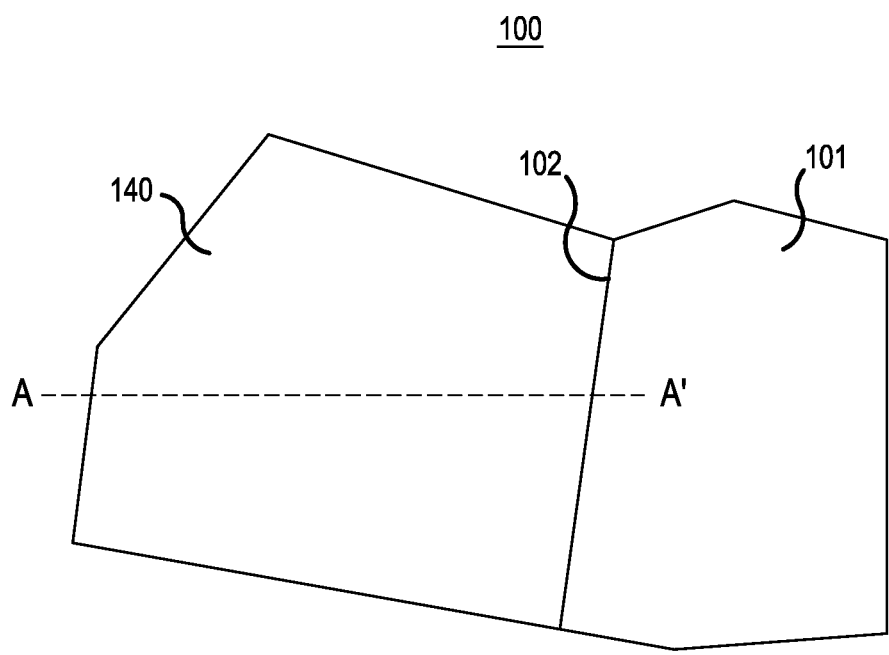
FIG. 1A is a top view of an acoustic resonator according to a representative embodiment.

In the following detailed description, for purposes of explanation and not limitation, example embodiments disclosing specific details are set forth in order to provide a thorough understanding of the present teachings. However, it will be apparent to one of ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms "a", "an" and "the" include both singular and plural referents, unless the context clearly dictates otherwise. Thus, for example, "a device" includes one device and plural devices. The terms "substantial" or "substantially" mean to within acceptable limits or degree. The term "approximately" means to within an acceptable limit or amount to one of ordinary skill in the art. Relative terms, such as "above," "below," "top," "bottom," "upper" and "lower" may be used to describe the various elements" relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other. In contrast, where a first device is said to be directly connected or directly coupled to a second device, this encompasses examples where the two devices are connected together without any intervening devices other than electrical connectors (e.g., wires, bonding materials, etc.).

The present teachings relate generally to acoustic resonators such as film bulk acoustic wave resonators (FBARs) or solidly mounted resonators (SMRs), for example. For simplicity of explanation, several embodiments are described in the context of FBAR technologies; however, the described concepts can be adapted for use in other types of acoustic resonators. Certain details of acoustic resonators, including materials and methods of fabrication, may be found in one or more of the following commonly owned U.S. Patents and Patent Applications: U.S. Pat. No. 6,107,721 to Lakin; U.S. Pat. Nos. 5,587,620, 5,873,153, 6,507,983, 6,384,697, 7,275,292 and 7,629,865 to Ruby et al.; U.S. Pat. No. 7,280,007 to Feng, et al.; U.S. Patent App. Pub. No. 2007/0205850 to Jamneala et al.; U.S. Pat. No. 7,388,454 to Ruby et al.; U.S. patent application Ser. No. 13/658,024 to Nikkel et al. (issued as U.S. Pat. No. 9,385,684 on Jul. 5, 2016); U.S. patent application Ser. No. 13/955,774 to Burak et al (issued as U.S. Pat. No. 9,246,473 on Jan. 26, 2016); U.S. Patent App. Pub. Nos. 2014/0118088 and 2014/0118091 to Burak et al.; U.S. patent application Ser. No. 13/654,718 to Burak et al. (issued as U.S. Pat. No. 9,099,983 on Aug. 4, 2015); U.S. Patent App. Pub. No. 2008/0258842 to Ruby et al.; and U.S. Pat. No. 6,548,943 to Kaitila et al. The disclosures of these patents and patent applications are hereby specifically incorporated by reference in their entireties. It is emphasized that the components, materials and method of fabrication described in these patents and patent applications are representative and other methods of fabrication and materials within the purview of one of ordinary skill in the art are contemplated.

Various electronic devices are operating at higher frequencies, requiring incorporation of acoustic resonators (e.g., as filters) with higher resonance frequencies (e.g., greater than or equal to about 3.5 GHz). Various embodiments of acoustic resonators described herein address problems associated with high resonance frequencies, some of which are identified above, by inserting one or more relatively thin air-gaps between one or both of the electrodes and the piezoelectric layer, respectively, thereby decoupling electrical excitation from acoustic propagation. Such acoustic resonators may be referred to as capacitive coupled resonators (CCRs) or hybrid-CCRs.

A conventional FBAR generally has a piezoelectric layer and two "thick" electrodes on either side to provide sufficiently low series resistance Rs. However, when frequency for which these resonators are designed is high (for example above 3.5 GHz) the electrodes may become prohibitively thin and the series resistance caused by these thin electrodes may become prohibitively large. Because a CCR has air-gaps between the piezoelectric layer and the electrodes, the electrodes may have arbitrary thicknesses (e.g., thicker than conventional electrodes in resonators designed for high operating frequencies) without adversely affecting the series resonance. A hybrid-CCR has "thin" metal layers on either side of the piezoelectric layer, for example, meaning that these metal layers alone would have too high of series resistances Rs to be used as stand-alone electrodes, but are thick enough to improve electromechanical coupling coefficient $Kt^2$ and Fractional Frequency Separation (FFS), as discussed below. To accommodate appropriate series resistance Rs in a hybrid-CCR, thicker electrodes (of arbitrary thickness) are provided, separated from the thin metal layers by air-gaps. As a practical matter, a thin electrode may be less than about 1000 Å, for example. The separating air-gaps practically eliminate impact of electrode thickness on series resistance Rs. Also, the piezoelectric layer may be excited by capacitive through-air coupling (via the air-gaps). Other benefits include providing approximately double the device area as compared to regular BAW resonators (leading to decreased perimeter-to-area loss), and increasing quality factor Q (Q-factor) across the pass-band of an acoustic resonator filter due to natural matching of cutoff frequencies in the active and field regions, which is analogous to a collar-effect without having to actually form a collar. Examples of collars and various benefits thereof are presented in U.S. Patent Application Publication No. 2014/0118091 (published May 1, 2014) to Burak et al., U.S. patent application Ser. No. 13/781,491 (filed Feb. 28, 2013) to Burak et al. (published as U.S. Patent App. Pub. No. 2014/0118087 on May 1, 2014), and U.S. patent application Ser. No. 13/955,774 (filed Jul. 31, 2013) to Burak et al. (issued as U.S. Pat. No. 9,246,473 on Jan. 26, 2016), which are hereby incorporated by reference in their entireties.

Notably, the air-gaps tend to reduce the electromechanical coupling coefficient $Kt^2$ of the piezoelectric layer. Thus, according to various embodiments, the piezoelectric layer may be doped with one or more rare earth elements (e.g., up to about 10 atomic percent scandium), to increase the electrometrical coupling coefficient $Kt^2$, as discussed below. The thickness of the piezoelectric layer may be increased, resulting in larger, more electrically robust acoustic resonator devices.

In representative embodiments, a bulk acoustic wave (BAW) resonator includes a bottom electrode disposed on a substrate, a piezoelectric layer disposed over the bottom electrode, and a top electrode disposed over the piezoelectric layer. The BAW resonator further includes at least one air-gap and corresponding support structure, where the at least one air-gap separates at least one of the bottom electrode and the top electrode from the piezoelectric layer, respectively. The at least one air-gap may have a single, substantially uniform height, or may be stepped to include multiple heights. When having multiple heights, the at least one air-gap may be narrower at a center region and thicker (or higher) at an edge region.

Figure 1B:
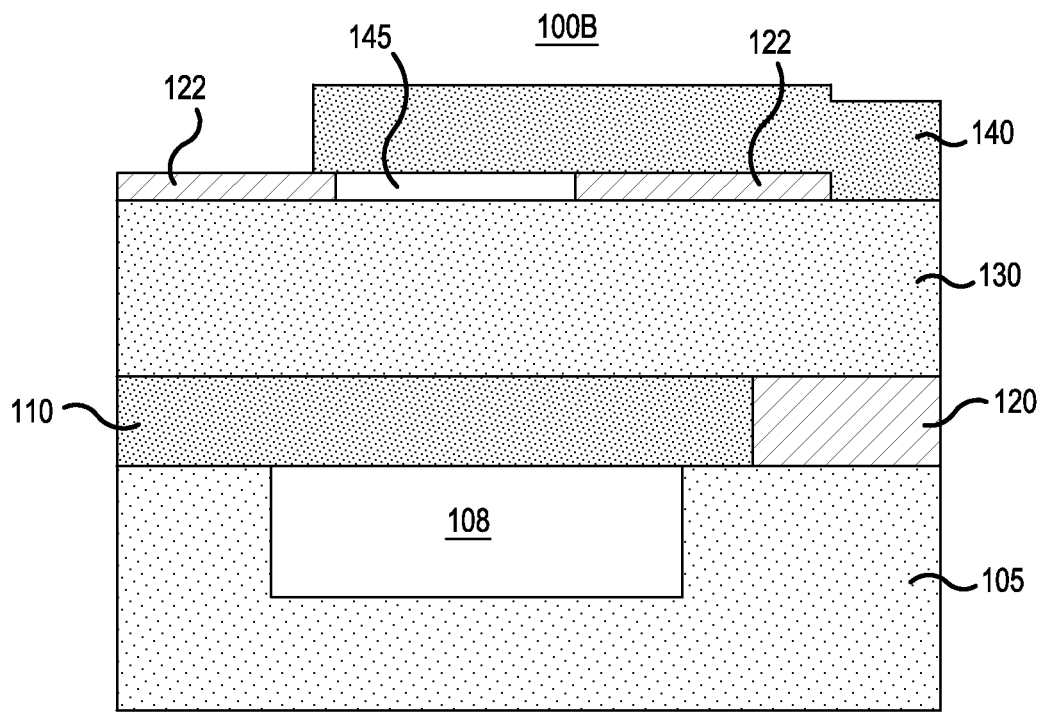
FIG. 1B is a cross-sectional view of an acoustic resonator according to a representative embodiment.
Figure 1C:
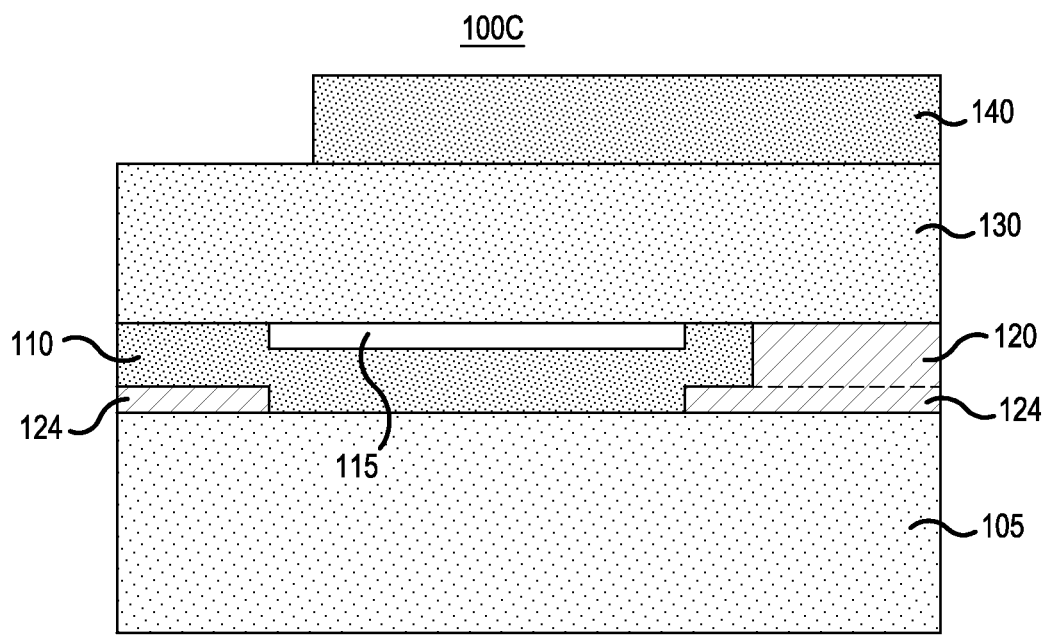
FIG. 1C is a cross-sectional view of an acoustic resonator according to a representative embodiment.
Figure 1D:
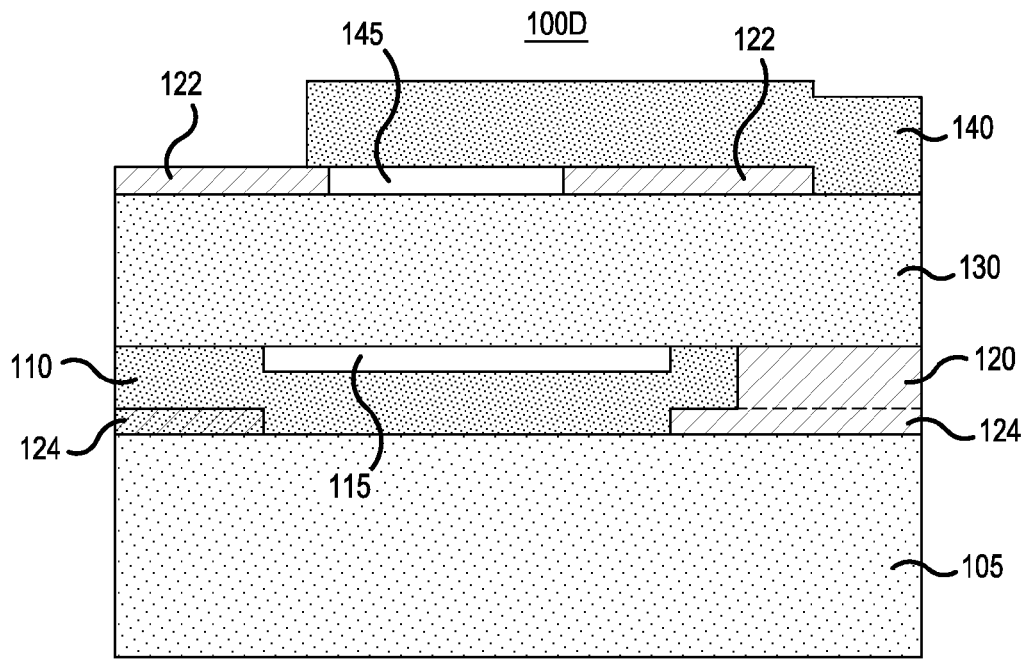
FIG. 1D is a cross-sectional view of an acoustic resonator according to a representative embodiment.

FIG. 1A is a top view of an acoustic resonator 100A according to a representative embodiment, and FIGS. 1B-1D are cross-sectional views of acoustic resonator 100A, taken along a line A-A" according to different embodiments. The cross-sectional views correspond to different variations of acoustic resonator 100A, respectively, as acoustic resonators 100B-100D, which may be referred to as capacitive coupled resonators (CCRs). Acoustic resonators 100B-100D have many of the same features, so a repetitive description of these features may be omitted in an effort to avoid redundancy.

Referring to FIG. 1A, acoustic resonator 100A comprises a top electrode 140 having five (5) sides, with a connection side 101 configured to provide an electrical connection to interconnect 102. Interconnect 102 provides electrical signals to top electrode 140 to excite desired acoustic waves in a piezoelectric layer (not shown in FIG. 1A) of acoustic resonator 100A.

The five sides of top electrode 140 have different lengths, forming an apodized pentagon shape. In alternative embodiments, top electrode 140 may have a different number of sides. Although not shown in the drawings, other embodiments of acoustic resonators, such as those of FIGS. 1B through 6C, may have an appearance similar to that of FIG. 1A when viewed from the top.

FIGS. 1B-1D are cross-sectional diagrams illustrating acoustic resonators, having air-gaps, according to representative embodiments. In the examples depicted in FIGS. 1B-1D (as well as the examples depicted in FIGS. 2A to 6C, discussed below), the acoustic resonators are FBARs for convenience of explanation. However, it is understood that other types of acoustic resonators, such as DBARs, CRFs and LCRFs, may be included without departing from the scope of the present teachings.

Referring to FIG. 1B, acoustic resonator 100B (e.g., an FBAR) comprises a substrate 105 defining a cavity 108 (e.g., air cavity), a bottom (first) electrode 110 disposed on the substrate 105 over the cavity 108, a planarization layer 120 disposed adjacent to bottom electrode 110 on the substrate 105, a piezoelectric layer 130 disposed on the bottom electrode 110 and the planarization layer 120, and a top (second) electrode 140 disposed over the piezoelectric layer 130, where a top air-gap 145 is formed between the piezoelectric layer 130 and the top electrode 140 (which may therefore be referred to as a lifted electrode). Collectively, bottom electrode 110, the piezoelectric layer 130, and the top electrode 140 constitute an acoustic stack of acoustic resonator 100B. Also, overlapping portions of the bottom electrode 110, the piezoelectric layer 130, the top air-gap 145 and the top electrode 140 over the cavity 108 define a main membrane region of the acoustic resonator 100B. Although not shown, a passivation layer may be present on top of top electrode 140 (and in each embodiment discussed herein) with thickness sufficient to insulate all layers of the acoustic stack from the environment, including protection from moisture, corrosives, contaminants, debris and the like.

In the depicted embodiment, the top air-gap 145 is formed by applying top support frame 122 on the piezoelectric layer 130, the top support frame 122 defining the top air-gap 145. For example, a top support layer, e.g., formed of non-etchable borosilicate glass (NEBSG) or non-conductive silicon carbide (SiC), may be deposited on the top surface of the piezoelectric layer 130, then patterned and etched to provide the top support frame 122 with an opening corresponding to the top air-gap 145. The top-air gap 145 may be filled with sacrificial material, such as phosphosilicate glass (PSG), and planarized along with the top support frame 122, using a chemical-mechanical polishing (CMP) process, for example. The top electrode 140 may then be deposited on the piezoelectric layer 130 and the planarized top surfaces of the top support frame 122 and the sacrificial material, which is subsequently removed to leave the top air-gap 145.

Notably, reference to the top air-gap 145 implies that it is "filled" with air. However, this terminology is used for the sake of convenience and is not intended to be limiting. That is, it is understood that the top air-gap 145 (as well as the other "air-gaps" identified herein) may constitute a vacuum, be filled with one or more gases other than air, or be filled with dielectric or metal material, to provide the desirably large acoustic impedance discontinuity depending on the specific implementation, without departing from the scope of the present teachings. The top air-gap may have a height (in the vertical direction) less than or equal to about 500 Å, for example. However, a thicker air-gap may be incorporated, or an air-gap having different heights, as discussed below with reference to FIGS. 6A-6C.

The substrate 105 may be formed of a material compatible with semiconductor processes, such as silicon (Si), gallium arsenide (GaAs), indium phosphide (InP), glass, sapphire, alumina, or the like, for example. The cavity 108 may be formed by etching a cavity in the substrate 105 and filling the etched cavity with a sacrificial material, such as PSG, for example, which is subsequently removed to leave an air space. Various illustrative fabrication techniques for an air cavity in a substrate are described by U.S. Pat. No. 7,345,410 (Mar. 18, 2008), to Grannen et al., which is hereby incorporated by reference in its entirety.

The bottom electrode 110 may be formed of one or more electrically conductive materials, such as various metals compatible with semiconductor processes, including tungsten (W), molybdenum (Mo), iridium (Ir), aluminum (Al), platinum (Pt), ruthenium (Ru), niobium (Nb), and/or hafnium (Hf), for example. In various configurations, the bottom electrode 110 may be formed of two or more layers of electrically conductive materials, which may by the same as or different from one another. Likewise, the top electrode 140 may be formed of electrically conductive materials, such as various metals compatible with semiconductor processes, including W, Mo, Ir, Al, Pt, Ru, Nb, and/or Hf, for example. In various configurations, the top electrode 140 may be formed of two or more layers of electrically conductive materials, which may by the same as or different from one another. Also, the configuration and/or the material(s) forming the top electrode 140 may be the same as or different from the configuration and/or the material(s) forming the bottom electrode 110.

The piezoelectric layer 130 may be formed of any piezoelectric material compatible with semiconductor processes, such as aluminum nitride (AlN), zinc oxide (ZnO), or zirconate titanate (PZT), for example. Of course, other materials may be incorporated into the above and other features of acoustic resonator 100B (as well as the other acoustic resonator described herein) without departing from the scope of the present teachings. Also, in various embodiments, piezoelectric layer 130 may be "doped" with at least one rare earth element, such as scandium (Sc), yttrium (Y), lanthanum (La), or erbium (Er), for example, to increase the piezoelectric coupling coefficient $e_{33}$ in the piezoelectric layer 130, thereby off-setting at least a portion of the degradation of the electromechanical coupling coefficient $Kt^2$ of the acoustic resonator caused by the top air-gap 145. Examples of doping piezoelectric layers with one or more rare earth elements for improving electromechanical coupling coefficient $Kt^2$ are provided by U.S. patent application Ser. No. 13/662,425 (filed Oct. 27, 2012), to Bradley et al. (issued as U.S. Pat. No. 9,225,313 on Dec. 29, 2015), and U.S. patent application Ser. No. 13/662,460 (filed Oct. 27, 2012), to Grannen et al. (issued as U.S. Pat. No. 9,136,819 on Sep. 15, 2015), which are hereby incorporated by reference in their entireties. Of course, doping piezoelectric layers with one or more rare earth elements may be applied to any of various embodiments, including the embodiments described below with reference to FIGS. 1C through 6C.

The planarization layer 120 may be formed of NEBSG, for example. In various embodiments, the planarization layer 120 is formed of the same material as the top support frame 122 to increase efficiency of the fabrication process. This particularly the case when an air-gap is formed between the bottom electrode 110 and the piezoelectric layer 130, such as bottom air-gap 115 discussed below with reference to FIGS. 1C and 1D, since the bottom air-gap 115 and the planarization layer 120 are adjacent and may be formed in consecutive steps. The planarization layer 120 is not strictly required for the functioning of acoustic resonator 100B, but its presence can confer various benefits. For instance, the presence of the planarization layer 120 tends to improve the structural stability of acoustic resonator 100B, may improve the quality of growth of subsequent layers, and may allow bottom electrode 110 to be formed without its edges extending beyond the cavity 108. Further examples of potential benefits of planarization and/or method of fabricating the same are presented in U.S. Patent Application Publication No. 2013/0106534 (published May 2, 2013) to Burak et al., and U.S. patent application Ser. No. 14/225,710 (filed Mar. 26, 2014) to Nikkel et al. (published as U.S. Patent App. Pub. No. 2015/0280679 on Oct. 1, 2015), which are hereby incorporated by reference in their entireties.

Generally, a conventional FBAR designed for high-frequencies, e.g., greater than or equal to approximately 3.5 GHz, has a relatively low Q-factor resulting from high series resistance Rs (due to thin electrodes) and low parallel resistance Rp (due to a thin piezoelectric layer resulting in small area and large perimeter-to-area radiative loss). In contrast, the acoustic resonator 100B (as well as the acoustic resonators discussed below with reference to the embodiments depicted in FIGS. 1C though 6C) maintain or enhance Q-factor by a number of means. For example, electrical current flow is decoupled from mass-loading of the acoustic resonator 100B. Also, lifted bottom and top electrodes 110 and 140 may be designed at any thickness that enables elimination of electrical series resistance Rs and viscous loss contributions. The thickness of the piezoelectric layer 130 is increased, resulting in an increased area of the resonator device (and thus lower perimeter-to-area loss, and larger parallel resistance Rp). For example, for 3.5 GHz signal, the thickness of the piezoelectric layer (e.g., formed ALN) would be approximately 15 kÅ. The thickness or height (vertical direction in FIG. 1B) of the top air-gap 145 may be about 100 Å, for example. With narrow top electrode 140 edge support regions (e.g., approximately 0.1 μm to approximately 0.2 μm), acoustic scattering at the edge of the top electrode 140 is eliminated by essentially matching cut-off frequencies in the main membrane region and the region covered by the top support frame 122 (so called field region). In addition, weak mass-loading of the field region provided by the thin top support frame 122 may yield simultaneous improvement in energy confinement (increased quality factor Q) over the whole pass-band of the acoustic resonator, including spectral regions from significantly below series resonance frequency Fs to above parallel resonance frequency Fp.

During illustrative operation of the acoustic resonator 100B (e.g., as a part of a ladder filter), an input electrical signal is applied to an input terminal of bottom electrode 110 and top electrode 140 is connected to the output terminal. The input electrical signal typically comprises a time-varying voltage that causes vibration in the main membrane region. This vibration in turn produces an output electrical signal at an output terminal of top electrode 140. The input and output terminals may be connected to bottom and top electrodes 110 and 140 via connection edges that extend away from the main membrane region. The input and output terminals of acoustic resonator 100B may be connected to appropriate terminals of other acoustic resonators forming the ladder filter, for instance.

In alternative configurations, an acoustic reflector or acoustic mirror, such as a distributed Bragg reflector (DBR), may formed on the substrate 105 in place of the cavity 108, making the acoustic resonator 100B an SMR, Alternatively, the DBR may be formed on the substrate in addition to the cavity to achieve specific resonator performance goals. Various illustrative fabrication techniques of acoustic mirrors are described by in U.S. Pat. No. 7,358,831 (Apr. 15, 2008), to Larson III, et al., which is hereby incorporated by reference in its entirety. It is understood that the same general configurations may be included in acoustic resonators having thin air-gaps in various locations, without departing from the scope of the present teachings.

Referring to FIG. 1C, acoustic resonator 100C is similar to the acoustic resonator 100B, except for formation of a bottom air-gap 115 between the bottom electrode 110 and the piezoelectric layer 130, instead of the top air-gap 145 between the piezoelectric layer 130 and the top electrode 140. Also, the substrate 105 of the acoustic resonator 100C does not include a cavity (such as cavity 108 in FIG. 1B), as discussed below.

More particularly, the bottom air-gap 115 is formed by applying bottom support frame 124 on the substrate 105 and applying the bottom electrode 110 on the bottom support frame, such that the bottom electrode 110 defines the bottom air-gap 115 having dimensions corresponding to an opening in the bottom support frame 124. For example, in an embodiment, a bottom support layer, e.g., formed of NEBSG, may be deposited on the top surface of the substrate 105, then patterned and etched to provide the bottom support frame 124 with an opening corresponding to the bottom air-gap 115. The bottom electrode 110 may then be formed on the bottom support frame 124 and a portion of the substrate 105 exposed through the opening of the bottom support frame 124. The shape of the opening in the bottom support frame 124 is translated to the top surface of the bottom electrode 110, thus defining the bottom air-gap 115. The planarization layer 120 is formed on the bottom support frame 124 (indicated by a dashed line), adjacent to the bottom electrode 110. The bottom air-gap 115 may be filled with sacrificial material, such as PSG, and planarized along with the bottom electrode 110 and the planarization layer 120, using a CMP process, for example. The piezoelectric layer 130 may then be formed on the planarized top surfaces of the bottom electrode 110, the planarization layer 120 and the sacrificial material, which is subsequently removed to leave the bottom air-gap 115. The bottom air-gap may have a height (in the vertical direction) less than or equal to about 500 Å, for example. However, a thicker air-gap (e.g., less than or equal to about 1000 Å) and/or an air-gap having multiple thicknesses may be incorporated, as discussed below with reference to FIGS. 6A-6C.

Accordingly, the acoustic resonator 100C includes the substrate 105, the bottom electrode 110 disposed on the substrate 105 and the bottom support frame 124, the planarization layer 120 disposed adjacent to bottom electrode 110 on the bottom support frame 124, the piezoelectric layer 130 disposed on the bottom electrode 110 and the planarization layer 120, and the top electrode 140 disposed on the piezoelectric layer 130. Collectively, bottom electrode 110, the piezoelectric layer 130, and the top electrode 140 constitute an acoustic stack of acoustic resonator 100C, and an overlap among the bottom electrode 110, the piezoelectric layer 130 and the top electrode 140 over the bottom air-gap 115 defines a main membrane region of the acoustic resonator 100C. The functionality and respective materials of various components of the acoustic resonator 100C are substantially the same as discussed above with reference to the acoustic resonator 100B.

As mentioned above, the acoustic resonator 100C does not include a cavity (like cavity 108) in the substrate 105 below the acoustic stack. This is because the air (or other gas(es) or vacuum, in certain configurations) in the bottom air-gap 115 will not transfer mechanical energy from the vibrating piezoelectric layer 130 to the bottom electrode 110. In other words, reflection from the bottom surface of piezoelectric layer 130 is substantially complete. Thus, there is no need to acoustically insulate the bottom electrode 110 from the substrate 105, e.g., by the additional cavity 108, because bottom electrode 110 is not vibrating.

Referring to FIG. 1D, acoustic resonator 100D is similar to the acoustic resonators 100B and 100C, except that it includes both top air-gap 145 between the piezoelectric layer 130 and the top electrode 140 (and corresponding top support frame 122), and bottom air-gap 115 between the bottom electrode 110 and the piezoelectric layer 130 (and corresponding bottom support frame 124). As discussed above, because the acoustic resonator 100D includes the bottom air-gap 115, there is no need for a cavity (such as cavity 108 in FIG. 1B) formed in the substrate 105 or a DBR formed on the substrate 105. The top and bottom air-gaps 145 and 115 may have approximately the same heights, or may have different heights, without departing from the scope of the present teachings.

In the acoustic resonator 100B, the top electrode 140 overlaps the piezoelectric layer 130 and bottom electrode 110 all the way to the edge of the cavity 108, and in the acoustic resonators 100C and 100D, the top electrode 140 overlaps the piezoelectric layer 130 and bottom electrode 110 all the way to the edge of the bottom air-gap 115, which may increase radiative loss due to the "dead-FBAR" effect. Generally, the dead-FBAR effect includes radiative losses caused by excitation of Mason pseudo-mode all the way to the edge of the cavity 108 (or the bottom air-gap 115), and from transducer effect over the substrate 105. These detrimental effects on performance can be addressed by creating an air-bridge under the top electrode 240 connecting edge, as shown in FIGS. 2A-2C, below.

Figure 2A:
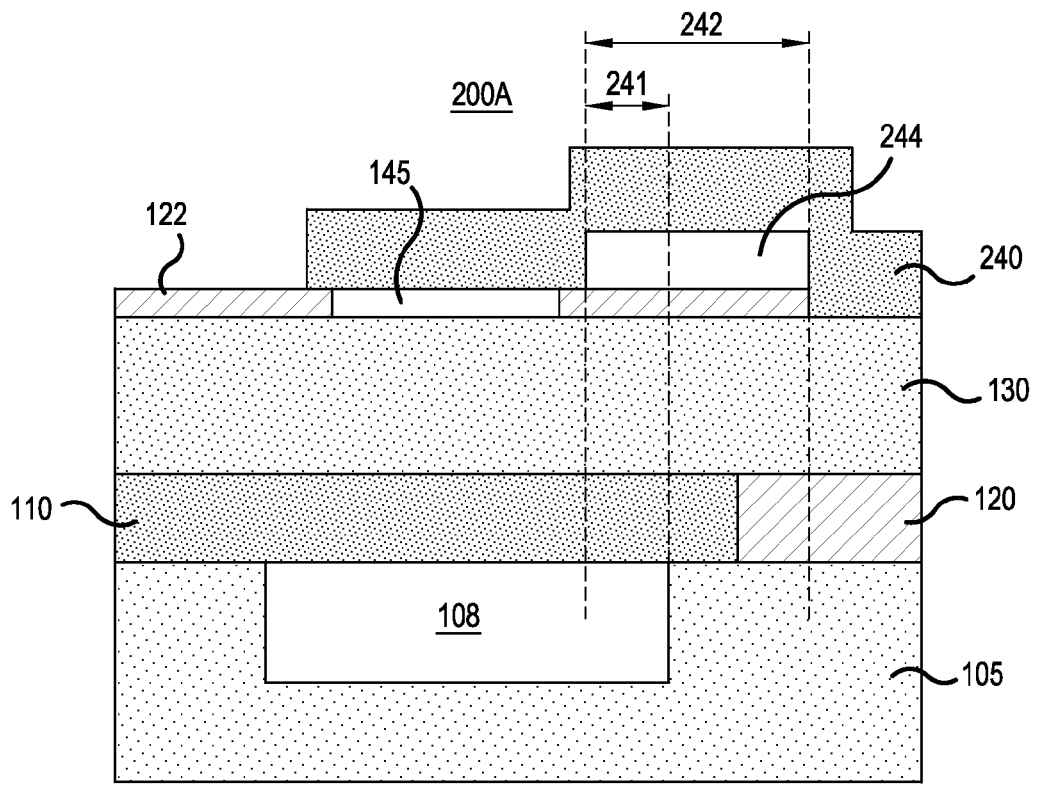
FIG. 2A is a cross-sectional view of an acoustic resonator according to a representative embodiment.
Figure 2B:
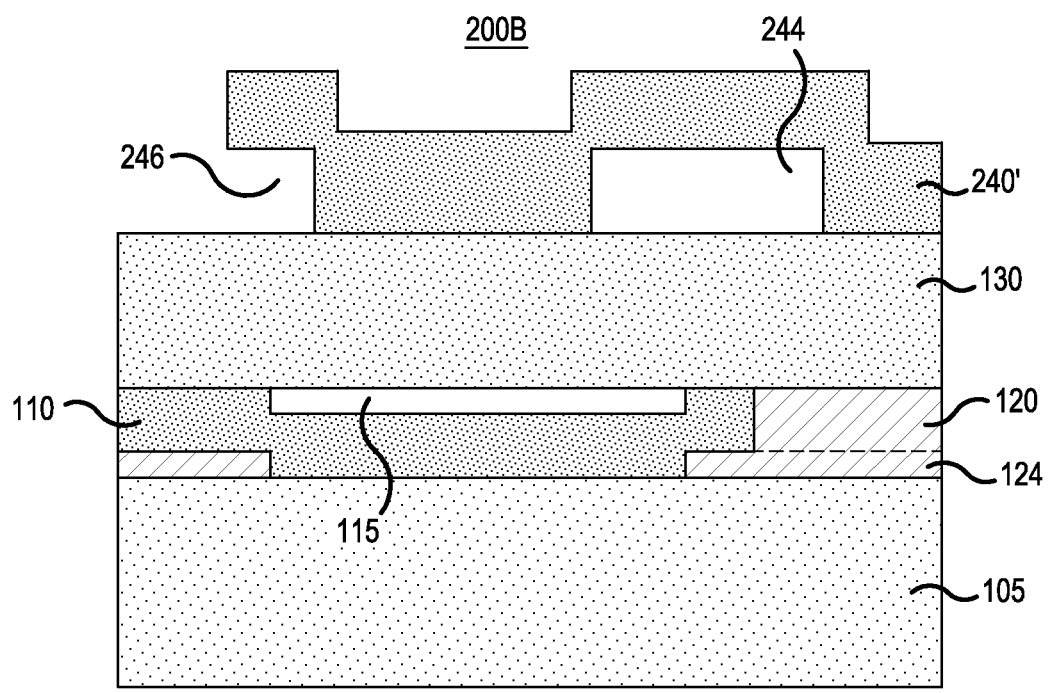
FIG. 2B is a cross-sectional view of an acoustic resonator according to a representative embodiment.
Figure 2C:
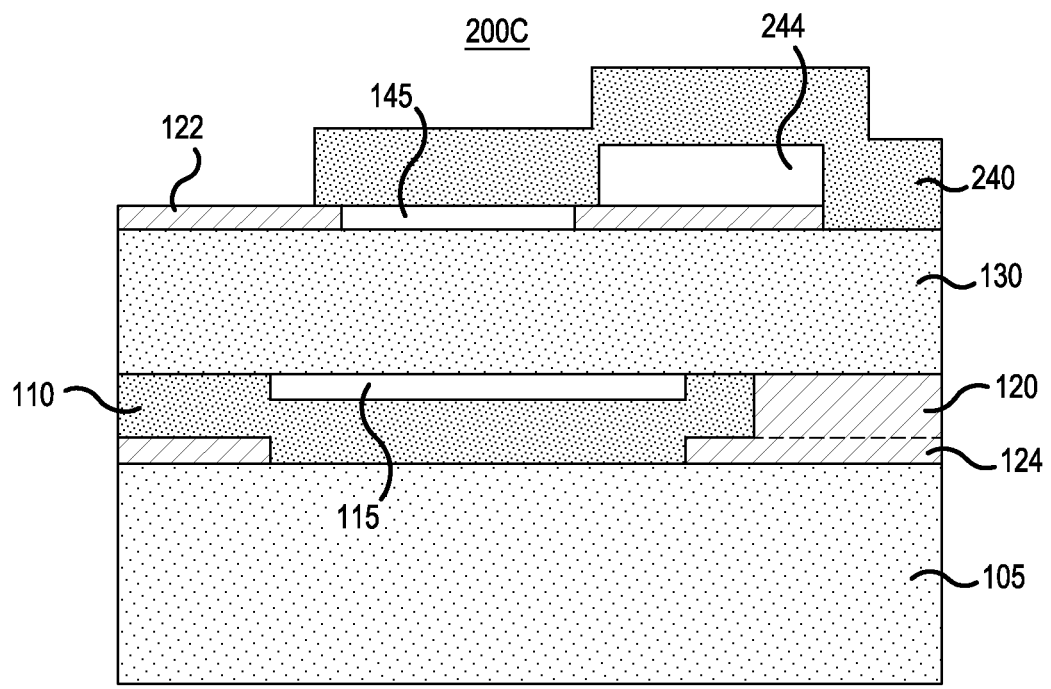
FIG. 2C is a cross-sectional view of an acoustic resonator according to a representative embodiment.

FIGS. 2A-2C are cross-sectional diagrams illustrating acoustic resonators, having air-gaps and air-bridges/air-wings, according to representative embodiments.

Referring to FIG. 2A, acoustic resonator 200A comprises a substrate 105 defining a cavity 108, a bottom electrode 110 disposed on the substrate 105 over the cavity 108, a planarization layer 120 disposed adjacent to bottom electrode 110 on the substrate 105, a piezoelectric layer 130 disposed on the bottom electrode 110 and the planarization layer 120, and a top electrode 240 disposed on the piezoelectric layer 130. Collectively, the bottom electrode 110, the piezoelectric layer 130, and the top electrode 240 constitute an acoustic stack of acoustic resonator 200A. Also, an overlap among the bottom electrode 110, the piezoelectric layer 130, the top air-gap 145 and the top electrode 240 over the cavity 108 defines a main membrane region of the acoustic resonator 200A. In addition, an air-bridge 244 is formed between the piezoelectric layer 130 and the top electrode 240, where an inner edge of the air-bridge 244 defines an outside boundary of the main membrane region. Although not shown, a passivation layer may be present on top of top electrode 240, as mentioned above.

Top air-gap 145 is formed between the piezoelectric layer 130 and the top electrode 240. In the depicted embodiment, the top air-gap 145 is formed by applying top support frame 122 on the piezoelectric layer 130, where the top support frame 122 defines an opening corresponding to the top air-gap 145, via a patterning and etching process, as discussed above. The top electrode 240 and at least a portion of the air-bridge 244 may then be formed over the piezoelectric layer 130 and the top support frame 122, leaving the top air-gap 145. In the depicted embodiment, the air-bridge 244 does not extend over the top air-gap 145 itself, although the air-bridge 244 may do so in alternative embodiments, without departing from the scope of the present teachings.

The air-bridge 244 is disposed on connection side 101 (in FIG. 1A) of the top electrode 240, and therefore is enclosed by the top electrode 240. Although the air-bridge 244 is shown with a rectangular cross-section, this structure (and other air-bridges or air-wings described herein) may have other shapes, such as trapezoidal cross-sectional shapes, without departing from the scope of the present teachings. Examples of formations, configurations, dimensions, alternative shapes, and the like with regard to air-bridges and/or air-wings are described and illustrated in U.S. Patent Application Publication No. 2012/0218057 (published Aug. 30, 2012) to Burak et al., U.S. Patent Application Publication No. 2010/0327697 (published Dec. 30, 2010) to Choy et al.; and U.S. Patent Application Publication No. 2010/0327994 (published Dec. 30, 2010) to Choy et al., the disclosures of which are hereby incorporated by reference in their entireties.

In certain embodiments, the air-bridge 244 (and other air-bridges described in connection with representative embodiments below) extends over the cavity 108 by a cavity overlap, referred to as decoupling region 241, determining separation of the outer edge of the main membrane region from the substrate 105 edge. Also, the air-bridge 244 extends over the piezoelectric layer 130 by an air-bridge extension region 242. The decoupling region 241 may have a width (x-dimension) of approximately 0.0 µm (i.e., no overlap with the cavity 108) to approximately 10.0 µm, and the air-bridge extension region 242 may have a width of approximately 0.0 µm (i.e., no air-bridge) to approximately 50.0 µm, for example. Also, in the depicted embodiment, the air-bridge 244 extends entirely over a portion of the top support frame 122. However, in alternative embodiments, the air-bridge 244 may extend entirely or partially over a top surface of the piezoelectric layer 130, without departing from the scope of the present teachings.

Generally, optimum widths of the decoupling region 241 and the air-bridge extension region 242 of the air-bridge 244 (and other air-bridges described in connection with representative embodiments below) depend on the reflection and suppression of the eigen-modes at the boundary of the main membrane region and the decoupling region 241. Due to substantially increased cut-off frequency of the combined bottom electrode 110 and piezoelectric layer 130 stack in the decoupling region 241, only complex evanescent modes (for the thickness-extensional motion) and propagating flexural and dilatational modes can exist at the operating frequency of the acoustic resonator 200A. Also, due to substantially increased cut-off frequency of the top electrode 240 in the air-bridge extension region 242, only complex evanescent modes (for the thickness-extensional motion) and propagating flexural and dilatational modes can exist at the operating frequency of the acoustic resonator 200A. The complex evanescent modes in the decoupling region 241 and the air-bridge extension region 242 are characterized by a characteristic decay length and by a specific propagation constant. Thus the air-bridge 244, for example, needs to be wide enough to ensure suitable decay of complex evanescent waves excited at the boundary of the main membrane region and the decoupling region and the air-bridge extension region 242. Descriptions regarding dimensions, properties and functionality of air-bridges are provided by U.S. patent application Ser. No. 14/192,599 (filed Feb. 27, 2014), to Burak et al. (published as U.S. Patent App. Pub. No. 2014/0176261 on Jun. 26, 2014), which is hereby incorporated by reference in its entirety.

The air-bridge 244 (and other bridges described in connection with representative embodiments below) has a height (vertical direction in FIG. 2A) of approximately 500 Å or more, up to approximately 5000 Å. Also, for a structure having a regular top electrode 240 (that is, no air-gap), an air-wing may be created to further minimize scattering at the top electrode 240 connecting edge and improve the performance, as discussed below with reference to FIG. 2B. Notably, the lower limit of the height is determined by the limits of the process of releasing sacrificial material in the forming of the air-bridge 244 (and other bridges described in connection with representative embodiments below), and the upper limit of the height is determined by the quality of layers deposited over the air-bridge 244 (and other bridges described in connection with representative embodiments) and by the quality of subsequent processing of possibly non-planar structures. Further, although referred to as an "air-bridge," this terminology is used for the sake of convenience and is not intended to be limiting. That is, it is understood that the air-bridge 244 (as well as the other "air-bridges" and/or "air-wings" identified herein) may constitute a vacuum or one or more gases other than air, depending on the specific implementation, without departing from the scope of the present teachings.

Referring to FIG. 2B, acoustic resonator 200B is similar to the acoustic resonator 200A, except for formation of a bottom air-gap 115 between the bottom electrode 110 and the piezoelectric layer 130, instead of the top air-gap 145 between the piezoelectric layer 130 and the top electrode 240'. Also, the substrate 105 of the acoustic resonator 200B does not include a cavity (such as cavity 108 in FIG. 2A). This is because the air (or other gas(es) or vacuum, in certain configurations) in the bottom air-gap 115 will not transfer mechanical energy from the vibrating piezoelectric layer 130 to the bottom electrode 110, as discussed above, so there is no need for the cavity or an acoustic reflector. The bottom air-gap 115 is formed as discussed above with reference to FIG. 1C, and thus the description will not be repeated.

In addition, both an air-bridge 244 and an air-wing 246 are formed between the piezoelectric layer 130 and the top electrode 240'. The respective inner edges of the air-bridge 244 and the air-wing 246 define the outside boundaries of the main membrane region. The air-wing 246 further minimizes scattering at the top electrode 240 connecting edge and improve the performance. The air-bridge 244 essentially minimizes the detrimental impact of the so-called "dead-FBAR" region, as discussed above. The air-wing 246 provides resonant suppression of total motion at the edge of the main membrane region, resulting in suppression of flexural, dilatational and complex evanescent modes supported by an outside region, which is the region where the bottom electrode 110 and the piezoelectric layer 130 are surrounded by air from below and above. The width (horizontal direction in FIG. 2B) of the air-bridge 244 defines the air-bridge extension region 242 and the width of the air-wing 246 defines an air-wing region 243, both of which are optimized for best performance of the acoustic resonator 200B.

Notably, reference to the air-bridge 244 and the air-wing 246 implies that they are "filled" with air. However, this terminology is used for the sake of convenience and is not intended to be limiting. That is, it is understood that the air-bridge 244 and/or the air-wing 246 gap (as well as the other "air-bridge" and "air-gap" identified herein) may constitute a vacuum, be filled with one or more gases other than air, or be filled with dielectric or metal material, to provide the desired acoustic impedance discontinuity depending on the specific implementation, without departing from the scope of the present teachings. Also, it is noted that the described structures do not necessarily have to extend along all edges of acoustic resonator 200A-200C. For example, they may be provided on only a subset of the five-sided acoustic resonator 100A shown in FIG. 1A. Also, in alternative configurations, an air-wing, such as air-wing 246, may be included in the acoustic resonator 200A in FIG. 2A and the acoustic resonator 200C in FIG. 2C (as well as any other acoustic resonator disclosed herein not expressly depicting an air-wing). The inclusion of an air-wing may improve energy confinement, e.g., since the bottom electrode 110 is connected to the piezoelectric layer 130 through overlap with the top support frame 122.

The acoustic impedance mismatches provided by air-bridge 244 and air-wing 246 cause reflection and suppression of acoustic waves at the boundary that may otherwise propagate out of the main membrane region resulting in energy loss. Accordingly, the air-bridge 244 and the air-wing 246 may serve to suppress excitation on unwanted propagating modes in the main membrane region and outside regions, resulting in better energy confinement within the main membrane region and reduction of energy losses to acoustic radiation in the acoustic resonator 200B. Reducing such losses increases the Q-factor of acoustic resonator 200B. In filter applications of acoustic resonator 200B, for example, as a result of the reduced energy loss, the insertion loss ($S_{21}$) may be beneficially improved.

Referring to FIG. 2C, acoustic resonator 200C is similar to the acoustic resonators 200A and 200B, except that it includes both top air-gap 145 between the piezoelectric layer 130 and the top electrode 240 (and corresponding top support frame 122), and bottom air-gap 115 between the bottom electrode 110 and the piezoelectric layer 130 (and corresponding bottom support frame 124).

In general, in order to control the size of an air-gap (e.g., top air-gap 145, bottom air-gap 115) across an acoustic resonator, all layers of the acoustic resonator should be grown in tensile stress individually. However, to provide greater control of an air-gap size, one or more support pillars may be implemented within an air-gap to provide structural support.

Figure 3A:
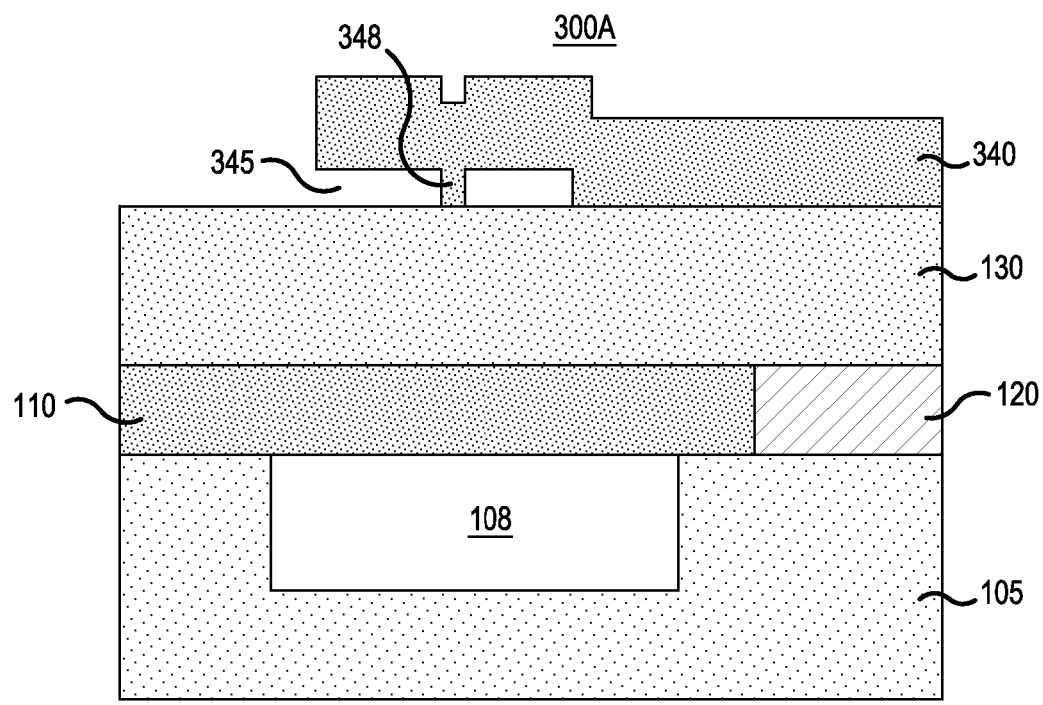
FIG. 3A is a cross-sectional view of an acoustic resonator according to a representative embodiment.
Figure 3B:
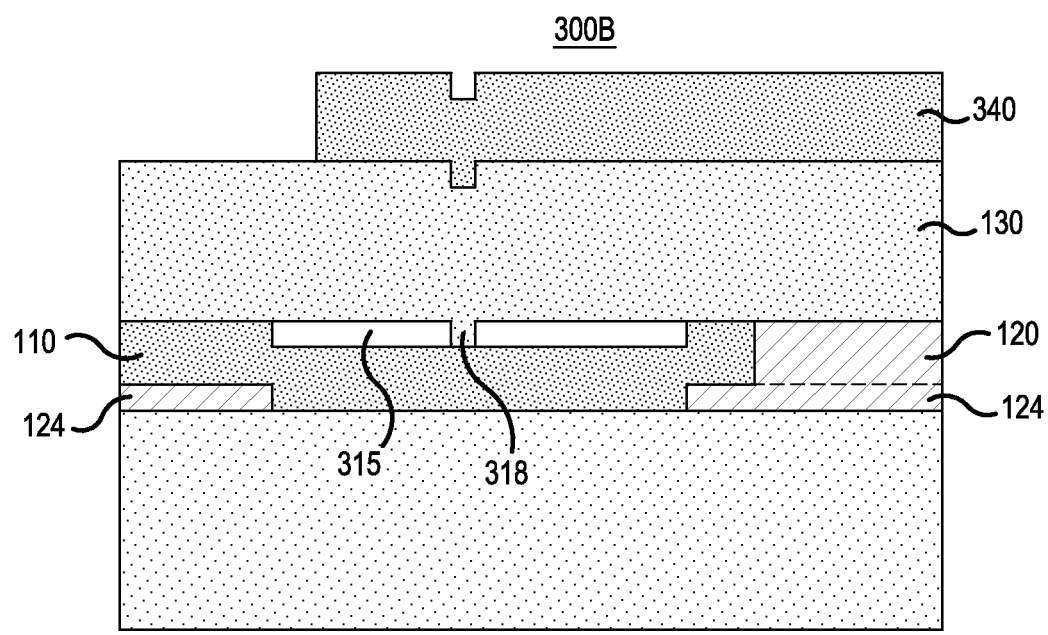
FIG. 3B is a cross-sectional view of an acoustic resonator according to a representative embodiment.
Figure 3C:
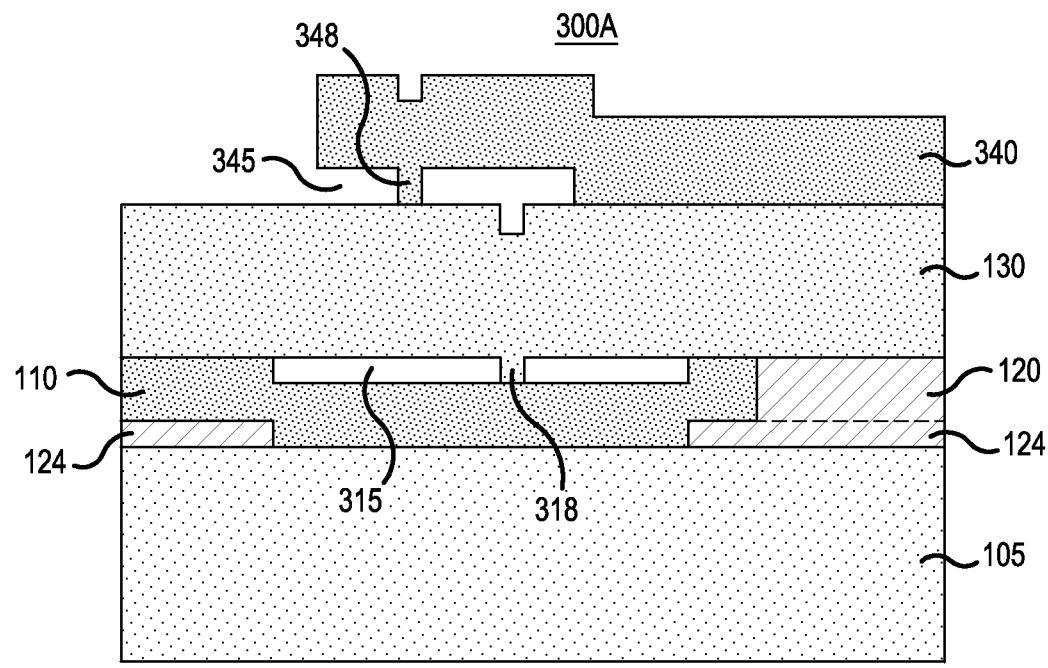
FIG. 3C is a cross-sectional view of an acoustic resonator according to a representative embodiment.

FIGS. 3A-3C are cross-sectional diagrams illustrating acoustic resonators, having air-gaps and corresponding support pillars, according to representative embodiments.

Referring to FIG. 3A, acoustic resonator 300A comprises a substrate 105 defining a cavity 108, a bottom electrode 110 disposed on the substrate 105 over the cavity 108, a planarization layer 120 disposed adjacent to bottom electrode 110 on the substrate 105, a piezoelectric layer 130 disposed on the bottom electrode 110 and the planarization layer 120, and a top electrode 340 disposed on the piezoelectric layer 130. Collectively, the bottom electrode 110, the piezoelectric layer 130, and the top electrode 340 constitute an acoustic stack of acoustic resonator 300A. Also, an overlap among the bottom electrode 110, the piezoelectric layer 130 and the top electrode 340 over the cavity 108 defines a main membrane region of the acoustic resonator 300A. Although not shown, a passivation layer may be present on top of top electrode 240, as mentioned above.

In addition, a top air-gap 345 is formed between the piezoelectric layer 130 and the top electrode 340. Unlike previously discussed embodiments, the top air-gap 345 is not supported by a top support frame, such as top support frame 122 shown FIGS. 1B, 1C, 2A and 2C. Rather, a top support pillar 348 is formed in the top air-gap 345 to provide structural support between the piezoelectric layer 130 and the top electrode 340 in a region above the top air-gap 345.

In an embodiment, the top support pillar 348 is part of the material forming the top electrode 340. For example, the top air-gap 345 and the corresponding top support pillar 348 may be formed by one or more small (e.g., about 1 μm²) openings in an air-gap pattern. More particularly, a top air-gap layer may be deposited on the top surface of the piezoelectric layer 130, where the top air-gap layer is formed of a sacrificial material, such as PSG for subsequent wet release. The top air-gap layer may then be patterned and etched to provide a top air-gap pattern, where the etching removes a portion of the top air-gap layer where the subsequently applied top electrode 340 contacts the piezoelectric layer 130 (e.g., the right side of the acoustic resonator 300A as shown in FIG. 3A) and defines an opening corresponding to the top support pillar 348. The top electrode 340 may then be deposited on the exposed portion of the piezoelectric layer 130 and the top surface of the top air-gap pattern, where a portion of the material forming the top electrode 340 fills the opening in the sacrificial material corresponding to the top support pillar 348. The sacrificial material is released, leaving the top air-gap 345 and the top support pillar 348, such that the top support pillar 348 comprises material of the top electrode 340 extending through the top air-gap 345 and connecting to the piezoelectric layer 130.

The depicted embodiment shows a single top support pillar 348, located at substantially the center of the top air-gap 345. However, it is understood that in alternative embodiments, multiple top support pillars 348 may be formed in the top air-gap 345, arranged in various patterns, to provide additional structural support, without departing from the scope of the present teachings. For example, FIGS. 7A-7D, discussed below, depict representative arrangements of support pillar(s) 778 in representative quadrilateral air-gap regions 771-774. It is understood that the support pillar(s) 778 may correspond to the top support pillar(s) 348 (as well as other top support pillar(s) in embodiments described herein), and that the quadrilateral air-gap regions 771-774 may correspond to the top air-gap 345 (as well as other top air-gaps in embodiments described herein).

Referring to FIG. 3B, acoustic resonator 300B is similar to the acoustic resonator 300A, except for formation of a bottom air-gap 315 and corresponding bottom support pillar 318 between the bottom electrode 110 and the piezoelectric layer 130, instead of the top air-gap 345 and the corresponding top support pillar 348 between the piezoelectric layer 130 and the top electrode 340. Also, the substrate 105 of the acoustic resonator 300B does not include a cavity (such as cavity 108 in FIG. 3A) because the air (or other gas(es) or vacuum, in certain configurations) in the bottom air-gap 315 will not transfer mechanical energy from the vibrating piezoelectric layer 130 to the bottom electrode 110, as discussed above, so there is no need for the cavity or an acoustic reflector.

More particularly, the bottom air-gap 315 is formed by applying bottom support frame 124 on the substrate 105 and applying the bottom electrode 110 on the bottom support frame, such that the bottom electrode 110 defines the bottom air-gap 115 having dimensions corresponding to an opening in the bottom support frame 124. For example, in an embodiment, a bottom support layer, e.g., formed of NEBSG, may be deposited on the top surface of the substrate 105, then patterned and etched to provide the bottom support frame 124 with an opening corresponding to the bottom air-gap 115. The bottom electrode 110 may then be formed on the bottom support frame 124 and a portion of the substrate 105 exposed through the opening of the bottom support frame 124. The shape of the opening in the bottom support frame 124 is translated to the top surface of the bottom electrode 110, thus defining the bottom air-gap 315. The planarization layer 120 is formed on the bottom support frame 124 (indicated by a dashed line), adjacent to bottom electrode 110.

The bottom air-gap 315 may be filled with sacrificial material, such as PSG, which is etched to form an opening corresponding to the bottom support pillar 318 extending from the bottom of the piezoelectric layer. More particularly, a bottom air-gap layer may be deposited on top surfaces of the bottom electrode 110 and the planarization layer 120, where the bottom air-gap layer is formed of a sacrificial material, such as PSG, for subsequent wet release. The bottom air-gap layer may then be patterned and etched to provide a bottom air-gap pattern, where the etching removes portions of the bottom air-gap layer from the bottom electrode 110 and the planarization layer 120, and defines an opening corresponding to the bottom support pillar 318 in the sacrificial material filling the bottom air-gap 315. The bottom electrode 110, the planarization layer 120, and the sacrificial material are planarized, using a CMP process, for example. The piezoelectric layer 130 may then be deposited on the planarized top surfaces of the bottom electrode 110, the planarization layer 120, and the sacrificial material, where a portion of the material forming the piezoelectric layer 130 fills the opening in the sacrificial material corresponding to the bottom support pillar 318. The sacrificial material is released, leaving the bottom air-gap 315 and the bottom support pillar 318. The bottom support pillar 318 thus comprises material of the piezoelectric layer 130 extending through the air-gap 315 and connecting to the bottom electrode 110.

The depicted embodiment shows a single bottom support pillar 318, located at about the center of the bottom air-gap 315. However, it is understood that in alternative embodiments, multiple bottom support pillars 318 may be formed in the bottom air-gap 315, arranged in various patterns, to provide additional structural support, without departing from the scope of the present teachings. For example, FIGS. 7A-7D, discussed below, depict representative arrangements of support pillar(s) 778 in representative quadrilateral air-gap regions 771-774. It is understood that the support pillar(s) 778 may correspond to the bottom support pillar(s) 318 (as well as other bottom support pillar(s) in embodiments described herein), and that the quadrilateral air-gap regions 771-774 may correspond to the bottom air-gap 315 (as well as other bottom air-gaps in embodiments described herein).

Accordingly, the acoustic resonator 300B includes the substrate 105, the bottom electrode 110 disposed on the substrate 105 and the bottom support frame 124, the planarization layer 120 disposed adjacent to bottom electrode 110 on the bottom support frame 124, the piezoelectric layer 130 disposed on the bottom electrode 110 and the planarization layer 120, and the top electrode 340 disposed on the piezoelectric layer 130. Collectively, bottom electrode 110, the piezoelectric layer 130, and the top electrode 340 constitute an acoustic stack of acoustic resonator 300B, and an overlap among the bottom electrode 110, the piezoelectric layer 130 and the top electrode 340 over the bottom air-gap 315 defines a main membrane region. As discussed above, because the acoustic resonator 300B includes the bottom air-gap 315, there is no need for a cavity (such as cavity 108 in FIG. 3A) formed in the substrate 105 or a DBR formed on the substrate 105. The functionality and respective materials of various components of the acoustic resonator 300B are substantially the same as discussed above with reference to the acoustic resonator 100B.

Referring to FIG. 3C, acoustic resonator 300C is similar to the acoustic resonators 300A and 300B, except that it includes both top air-gap 345 and corresponding top support pillar 348 between the piezoelectric layer 130 and the top electrode 340, and bottom air-gap 315 and corresponding bottom support pillar 318 between the bottom electrode 110 and the piezoelectric layer 130.

Notably, referring to FIGS. 3A-3C, an increased number and size of top and bottom support pillars 348 and 318 may adversely affect performance of the acoustic resonators 300A-300C, respectively, by increasing acoustic scattering at the perimeter of each top support pillar 348 and/or bottom support pillar 318. Also, the bottom support pillars 318, in particular, may result in adverse transducer loss due to direct connection to substrate 105. Beneficially, though, the presence of top and/or bottom support pillars 348 and 318 may allow additional flexibility in designing mass-load thickness of the support frames, such as the top support frame 122 shown in FIGS. 1A, 1C, 2A and 2C, and the bottom support frame 124 shown in FIGS. 1B, 1C, 2B and 2C, optimizing for parallel resistance Rp and wide-band quality factor Q performance. Indeed, top and/or bottom support frames may be eliminated completely when top and/or bottom support pillars 348 and 318 are incorporated into the acoustic resonators, as indicated by FIGS. 3A-3C (which do not include top or bottom support frames, for purposes of illustration).

As discussed above, particularly with regard to FIGS. 2A-2C, when a top electrode overlaps the piezoelectric layer and the bottom electrode all the way to the edge of the substrate cavity, radiative loss due to the "dead-FBAR" effect (that is, radiative losses caused by excitation of the Mason pseudo-mode all the way to the edge of the substrate cavity, and from transducer effect over the substrate) may be increased. Air-bridges (and air-wings) under the top electrode connecting edge may be used for minimize these sources of radiative loss and increase performance at parallel resonance frequency Fp, for example. In addition, support pillars, discussed above, included with an air-bridge and/or air-wing under the top electrode connecting edge may allow additional flexibility in designing mass-load thickness of the edge supporting region, in which case it would not be needed for support function, in order to optimize wide-band performance, that is, both above series resonance frequency Fs (e.g. at the parallel resonance frequency Fp), as well as below series resonance frequency Fs (e.g. by minimizing the so-called "rattles" in south-west region of a Smith-chart).

Generally, rattles is caused by excitation of a propagating thickness extensional mode pTE1, e.g., at the edge of the top electrode (e.g., top electrode 340) for driving frequencies below series resonance frequency Fs. For so-called type-II acoustic stacks (as considered in the present teaching), the evanescent eTE1 mode above series resonance frequency Fs corresponds to propagating pTE1-mode below series resonance frequency Fs. In a regular FBAR (i.e., an FBAR where piezoelectric layer is stacked on top of the bottom electrode, and top electrode is stacked on top of piezoelectric layer, without air-gaps between layers), the total motion at the top electrode edge is suppressed due to the fact that the field region (outside of the top electrode) is far-off resonance as compared to the main membrane region. For a driving frequency below the series resonance frequency Fs, that suppression of the total motion at the top electrode edge is accomplished by excitation of pTE1-mode in opposite phase to the Mason pseudo-mode.

However, since pTE1-eigen-mode supports both longitudinal and shear components, and Mason pseudo-mode is purely longitudinal, generally only a partial suppression of the total motion at the electrode edge can be accomplished. For example when shear component of pTE1-mode forms nodes (nulls) at the edges of the top electrode (as determined by the lateral extension of the active region and dispersion diagram for stack eigen-modes), a close to complete suppression of total motion may occur and the radiative loss is minimized. However, when shear component of pTE1-mode forms anti-nodes (attains maximum values) at the edges of the top electrode, a suppression of total motion cannot occur and the radiative loss is maximized by excitation of additional propagating modes supported by the stacks on both sides of top electrode edge. At the frequency corresponding to maximum radiative loss (or anti-nodes of the pTE1-mode shear components at the top electrode edges), the so called rattle is formed in the Smith-chart indicating enhanced radiative loss and significantly lowered quality factor Q of the resonator at that frequency. In other words, a rattle is manifested in the Smith-chart as a loop or an indentation where the scattering parameter S significantly deviates from the unit circle, as should be appreciated by one skilled in the art.

However, the rattle formation may be minimized in FBARs, as shown in FIGS. 3A and 3C, by providing weak mass-loading using the support frames (e.g., top support frames 122). In such cases, in the electrically excited main membrane region, Mason pseudo-mode acoustically couples to the eTE1 mode of the supporting frame region, thus minimizing unwanted acoustic energy scattering at the top electrode edge and maximizing quality factor Q across the whole passband. In other words, the presence of support frame (not connected to the top electrode edge) may allow the piston mode in the main membrane region to couple predominantly to eTE1 mode in the support frame region rather than to pTE1-mode of main membrane region, provided that the designed support frame cutoff frequency is slightly above the minimum driving frequency for which the FBAR is being designed. As a result, rattles below the series resonance frequency Fs are suppressed.

Accordingly, combining air-bridges and/or air-wings, discussed with reference to FIGS. 2A-2C, with the top and/or bottom support pillars, discussed above with reference to FIGS. 3A-3C, and with detached support frames discussed above with reference to FIGS. 1A-1C further optimizes performance of acoustic resonators.

Figure 4A:
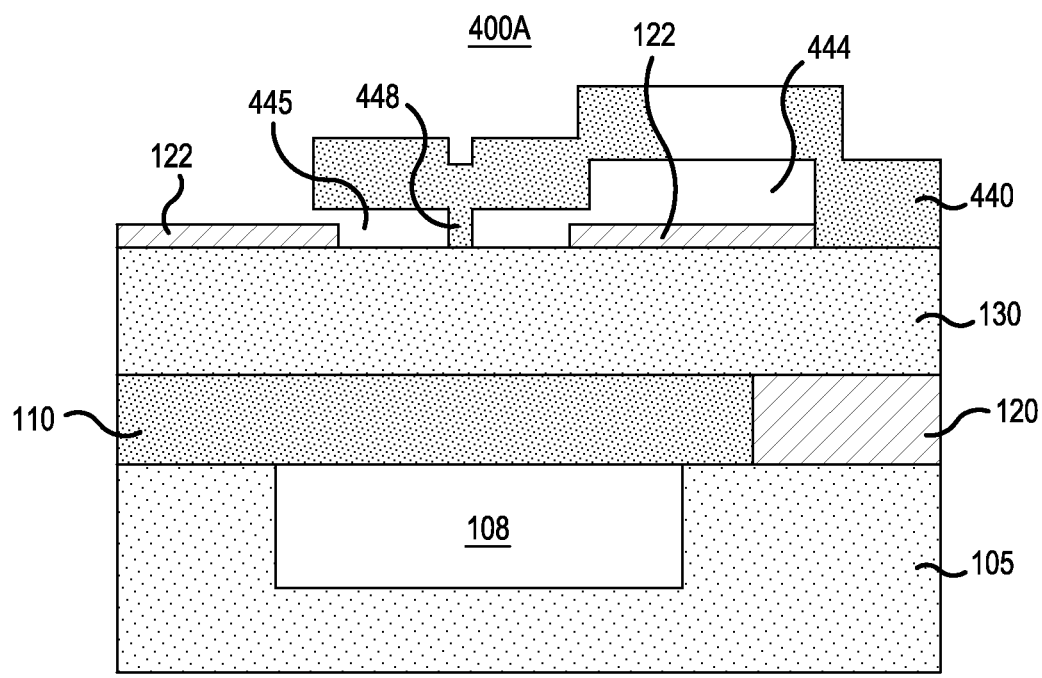
FIG. 4A is a cross-sectional view of an acoustic resonator according to a representative embodiment.
Figure 4B:
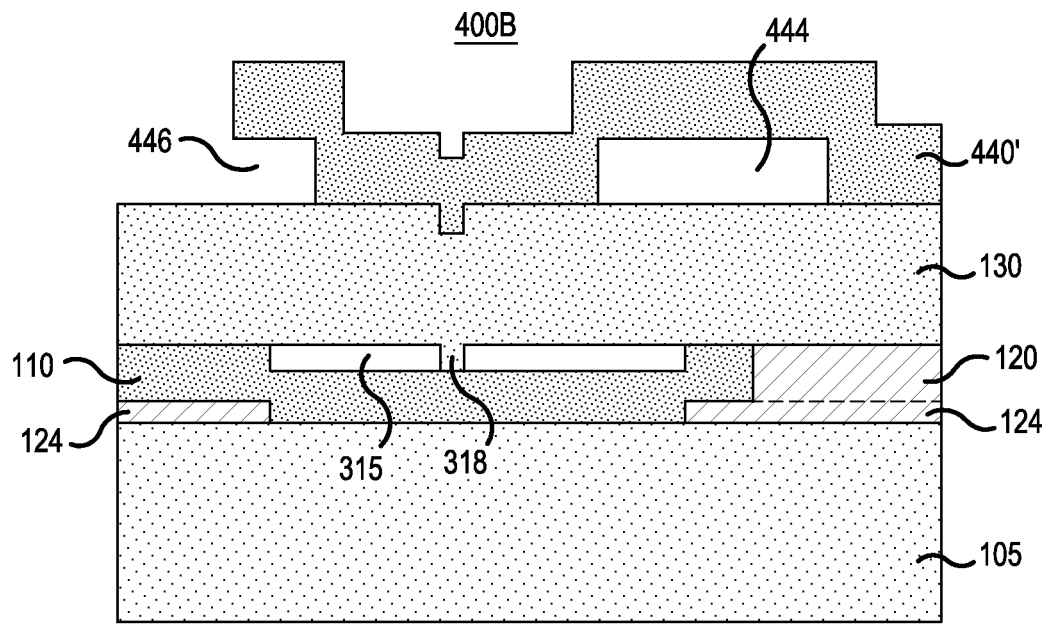
FIG. 4B is a cross-sectional view of an acoustic resonator according to a representative embodiment.
Figure 4C:
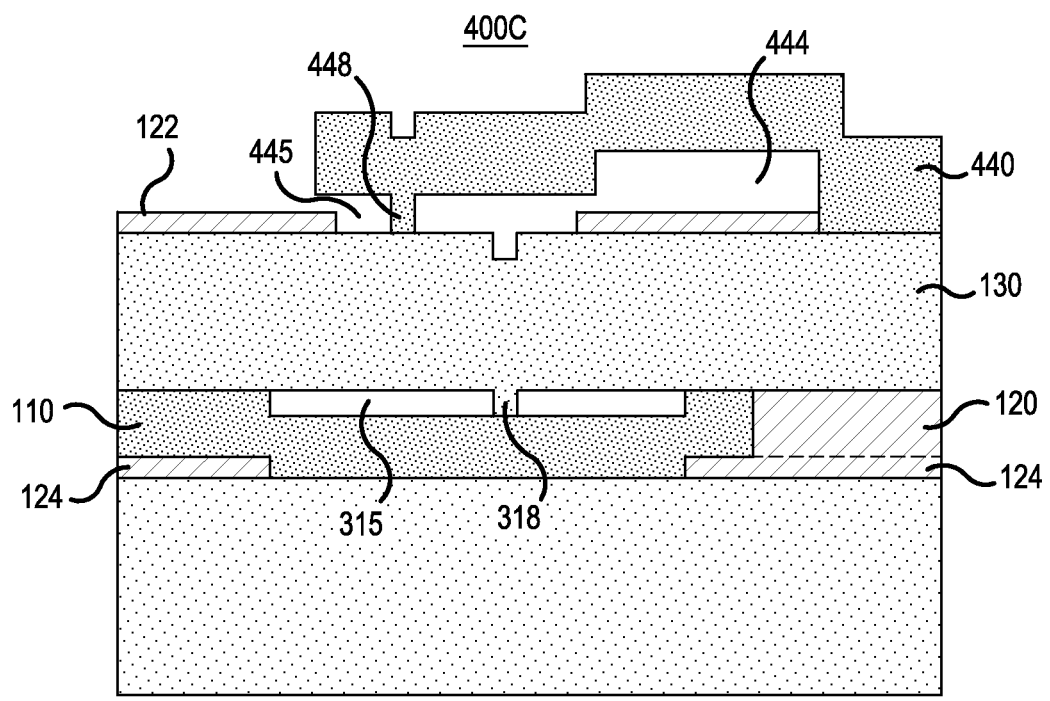
FIG. 4C is a cross-sectional view of an acoustic resonator according to a representative embodiment.

FIGS. 4A-4C are cross-sectional diagrams illustrating acoustic resonators, having air-gaps and corresponding support pillars, as well as air-bridges and/or air-wings, according to representative embodiments.

Referring to FIG. 4A, acoustic resonator 400A comprises a substrate 105 defining a cavity 108, a bottom electrode 110 disposed on the substrate 105 over the cavity 108, a planarization layer 120 disposed adjacent to bottom electrode 110 on the substrate 105, a piezoelectric layer 130 disposed on the bottom electrode 110 and the planarization layer 120, and a top electrode 440 disposed on the piezoelectric layer 130. Top air-gap 445 is formed between the piezoelectric layer 130 and the top electrode 440. Collectively, the bottom electrode 110, the piezoelectric layer 130, and the top electrode 440 constitute an acoustic stack of acoustic resonator 400A, and an overlap among the bottom electrode 110, the piezoelectric layer 130, top air-gap 445 and the top electrode 440 over the cavity 108 defines a main membrane region of the acoustic resonator 400A. In addition, an air-bridge 444 is formed between the piezoelectric layer 130 and the top electrode 440, where an inner edge of the air-bridge 444 defines an outside boundary of the main membrane region. Although not shown, a passivation layer may be present on top of top electrode 440, as mentioned above.

In the depicted embodiment, the top air-gap 445 is formed by applying top support frame 122 on the piezoelectric layer 130, where the top support frame 122 defines an opening corresponding to the top air-gap 445, via a patterning and etching process, as discussed above with respect to the top air-gap 145. The top electrode 440 and at least a portion of the air-bridge 444 may then be formed over the piezoelectric layer 130 and the top support frame 122, leaving the top air-gap 445. In the depicted embodiment, the air-bridge 444 does not extend over the top air-gap 445 itself, although the air-bridge 444 may do so in alternative embodiments, without departing from the scope of the present teachings.

In addition, a top support pillar 448 is formed in the top air-gap 445 to provide structural support between the piezoelectric layer 130 and the top electrode 440 in a region above the top air-gap 445. In an embodiment, the top support pillar 448 may provide structural support in addition to structural support provided by the top support frame 122 to maintain the top air-gap 445. In an alternative embodiment, as the top support pillar 448 may provide the structural support, without the assistance of the top support frame 122, which is the configuration shown in FIG. 4A. In this case, a gap may exist between the top electrode 440 and the top support frame 122 in the vicinity of the top air-gap 445. In an embodiment, the top support pillar 448 is part of the material forming the top electrode 440, and may be formed as discussed above with the top support pillar 348.

Referring to FIG. 4B, acoustic resonator 400B is similar to the acoustic resonator 400A, except for formation of a bottom air-gap 315 and corresponding bottom support pillar 318 between the bottom electrode 110 and the piezoelectric layer 130, instead of the top air-gap 445 and the corresponding top support pillar 448 between the piezoelectric layer 130 and the top electrode 440. Also, there is no top support frame 122 on the piezoelectric layer 130, such that the top electrode 440' (defining the air-bridge 444) is formed directly on the top surface of the piezoelectric layer 130. The substrate 105 of the acoustic resonator 400B does not include a cavity (such as cavity 108 in FIG. 4A) because the air (or other gas(es) or vacuum, in certain configurations) in the bottom air-gap 315 will not transfer mechanical energy from the vibrating piezoelectric layer 130 to the bottom electrode 110, as discussed above. The formation and functionality of the bottom air-gap 315 and the corresponding bottom support pillar 318 are substantially the same as discussed above with reference to FIG. 3C, and thus the description will not be repeated.

In addition, both the air-bridge 444 and an air-wing 446 are formed between the piezoelectric layer 130 and the top electrode 440'. The respective inner edges of the air-bridge 444 and the air-wing 446 define the outside boundaries of the main membrane region. The formation and functionality of the air-bridge 444 and the air-wing 446 are substantially the same as the air-bridge 244 and the air-wing 246, discussed above with reference to FIG. 2B, and thus the description will not be repeated.

Referring to FIG. 4C, acoustic resonator 400C is similar to the acoustic resonators 400A and 400B, except that it includes both top air-gap 445 and corresponding top support pillar 448 between the piezoelectric layer 130 and the top electrode 440, and bottom air-gap 315 and corresponding bottom support pillar 318 between the bottom electrode 110 and the piezoelectric layer 130. Also included is top support frame 122 formed on the piezoelectric layer 130, and the air-bridge 444 defined by the top electrode 440.

From a device physics point of view of a CCR, such as acoustic resonators 100B to 400C discussed above, relatively small series capacitance may be presented by the top and bottom air-gaps resulting in a relatively low electromechanical coupling coefficient $Kt^2$. Also, the difference between second order thickness shear mode TS2 and fundamental thickness extensional mode TE1 (TS2-TE1), or fractional frequency separation (FFS), of the piezoelectric layer may be relatively low, resulting in large acoustic loss per unit perimeter length driven by E-field discontinuity at the top electrode edge. These issues may be addressed in various embodiments by adding thin metal (e.g., Mo or W) mass-loading layers on either or both sides of the piezoelectric layer, as shown in FIGS. 5A-5C, below.

By electrically shorting the thin metal layer(s) with the supporting pillar(s), the effect of the series capacitance can be eliminated to large degree, depending on the number, sizes and locations of the support pillars. Also, electrically shorting the thin metal layer(s) reduces voltage drop across the air-gap and increases electromechanical coupling coefficient $Kt^2$. Thin metal layers with high acoustic impedance also enable the electromechanical coupling coefficient $Kt^2$ to increase by improving energy confinement in the center of the acoustic stack. Moreover, depending on the thickness of the thin metal layer(s), the FFS piezoelectric layer may be increased from about 15 percent to more than 50 percent.

Figure 5A:
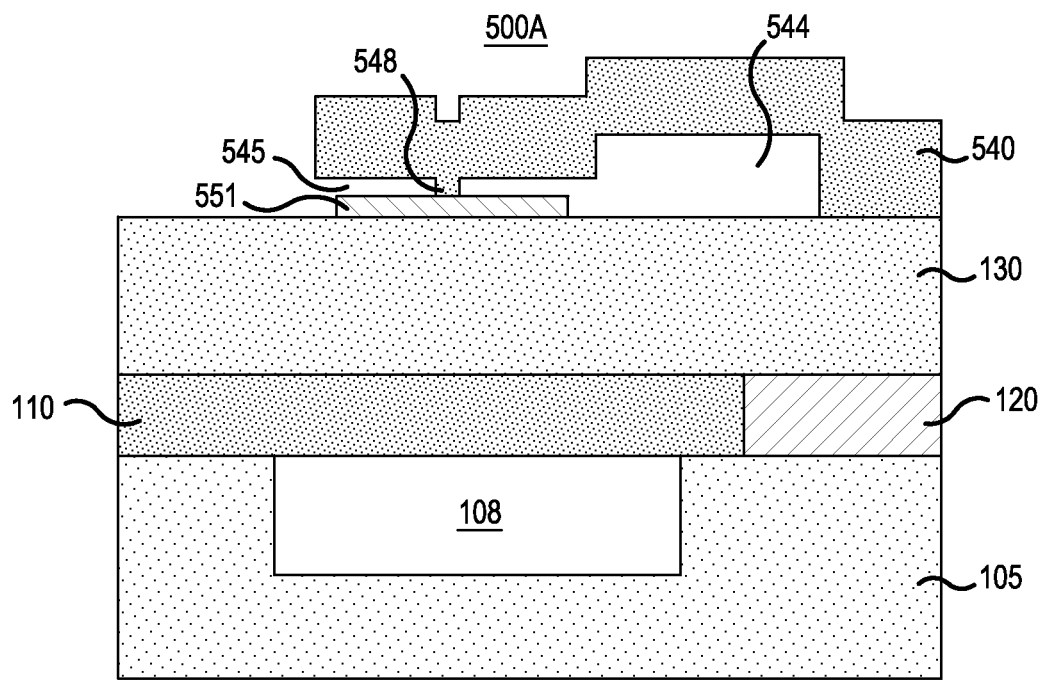
FIG. 5A is a cross-sectional view of an acoustic resonator according to a representative embodiment.
Figure 5B:
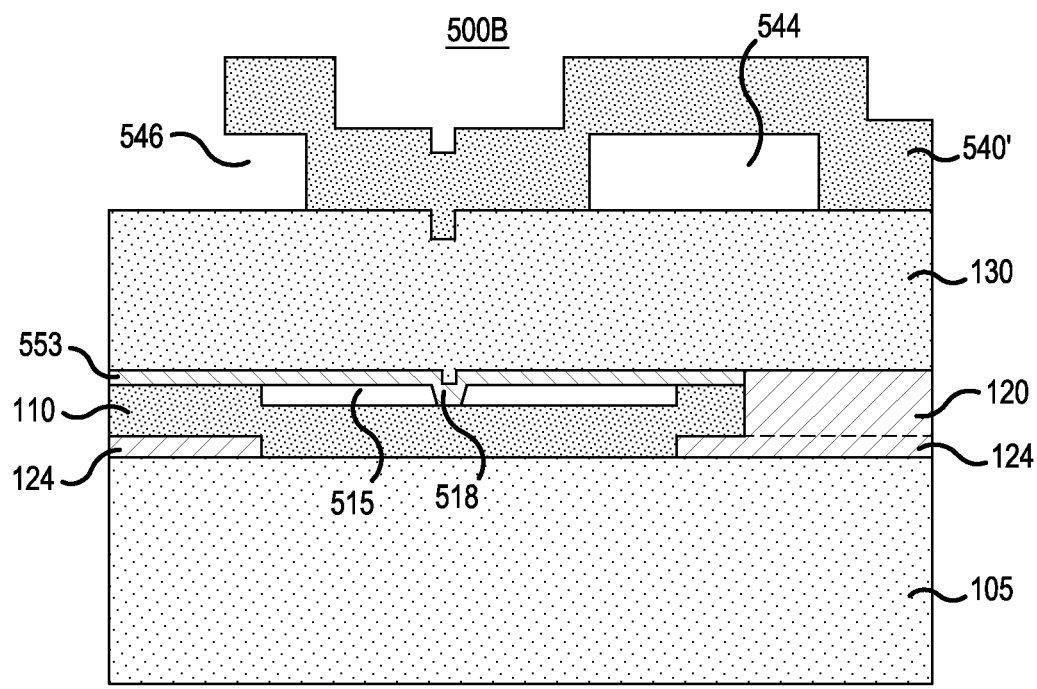
FIG. 5B is a cross-sectional view of an acoustic resonator according to a representative embodiment.
Figure 5C:
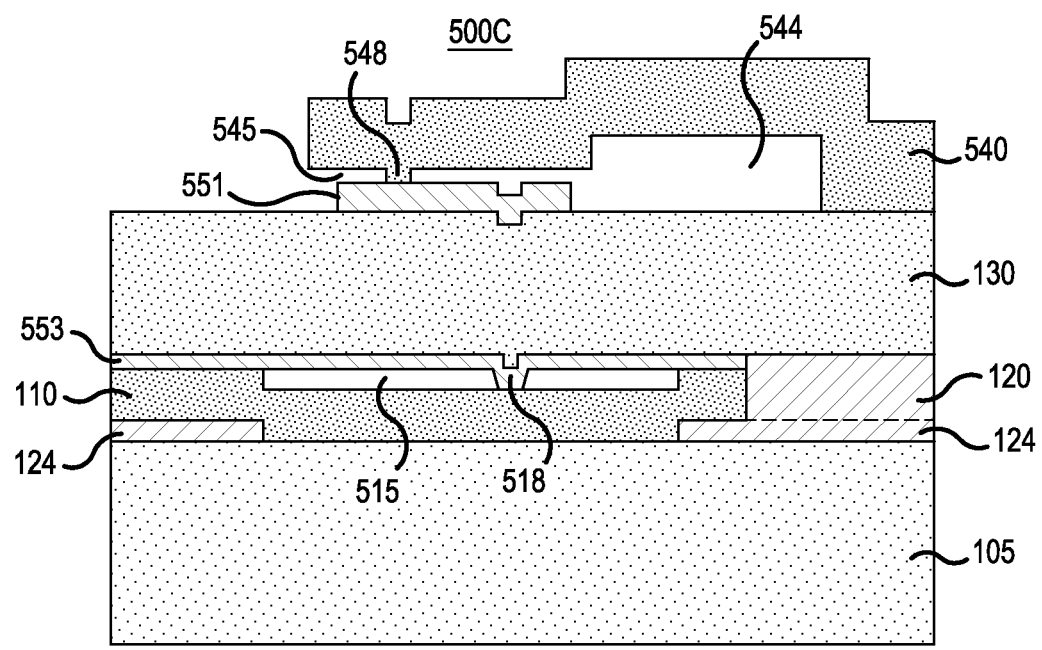
FIG. 5C is a cross-sectional view of an acoustic resonator according to a representative embodiment.

FIGS. 5A-5C are cross-sectional diagrams illustrating hybrid capacitive coupled resonators (hybrid-CCRs), mentioned above, having air-gaps and corresponding support pillars, thin metal layers, and air-bridges and/or air-wings, according to representative embodiments.

Referring to FIG. 5A, acoustic resonator 500A comprises a substrate 105 defining a cavity 108, a bottom electrode 110 disposed on the substrate 105 over the cavity 108, a planarization layer 120 disposed adjacent to bottom electrode 110 on the substrate 105, a piezoelectric layer 130 disposed on the bottom electrode 110 and the planarization layer 120, and a top electrode 540 disposed on the piezoelectric layer 130. Collectively, the bottom electrode 110, the piezoelectric layer 130, and the top electrode 540 constitute an acoustic stack of acoustic resonator 500A, and an overlap among the bottom electrode 110, the piezoelectric layer 130 and the top electrode 540 over the cavity 108 defines a main membrane region of the acoustic resonator 500A. In addition, an air-bridge 544 is formed between the piezoelectric layer 130 and the top electrode 540, where an inner edge of the air-bridge 544 defines an outside boundary of the main membrane region. Although not shown, a passivation layer may be present on top of top electrode 540, as mentioned above.

In the depicted embodiment, a top thin metal layer 551 is formed on the piezoelectric layer 130. The top thin metal layer 551 may be formed of tungsten (W) or molybdenum (Mo), for example, and have a thickness ranging from about 50 Å to about 1000 Å. A top air-gap 545 is formed between the top thin metal layer 551 and the top electrode 540, where a top support pillar 548 is formed in the top air-gap 545 to provide structural support between top thin metal layer 551 and the top electrode 540. In an embodiment, the top support pillar 548 is part of the material forming the top electrode 540, and may be formed as discussed above with the top support pillar 348. Also, in the depicted embodiment, the air-bridge 544 does not extend over the top air-gap 545 or the top thin metal layer 551, although the air-bridge 544 may do so in alternative embodiments, without departing from the scope of the present teachings.

To from the top thin metal layer 551, a top metal layer may be deposited on the top surface of the piezoelectric layer 130. The top metal layer may then be patterned and etched to provide the top thin metal layer 551. A top air-gap layer is formed on the top thin metal layer 551 and exposed portions of the piezoelectric layer 130, where the top air-gap layer is formed of a sacrificial material, such as PSG for subsequent wet release. The top air-gap layer may then be patterned and etched to provide a top air-gap pattern, where the etching removes a portion of the top air-gap layer where the subsequently applied top electrode 540 contacts the piezoelectric layer 130 (e.g., the right side of the acoustic resonator 500A as shown in FIG. 5A) and defines an opening corresponding to the top support pillar 548. The patterning and etching may be a two stage process such that the remaining sacrificial material over the top thin metal layer 551 is thinner than the remaining sacrificial material over the piezoelectric layer 130 at the location of the air-bridge 544. The top electrode 540 may then be deposited on the exposed portion of the piezoelectric layer 130 and the top surface of the top air-gap pattern, where a portion of the material forming the top electrode 540 fills the opening in the sacrificial material corresponding to the top support pillar 548. The sacrificial material is released, leaving the top air-gap 545 and the top support pillar 348, such that the top support pillar 548 comprises material of the top electrode 540 extending through the top air-gap 545 and connecting to the piezoelectric layer 130. Releasing the sacrificial material also provides the air-bridge 544 between the top electrode 540 and the piezoelectric layer 130.

Referring to FIG. 5B, acoustic resonator 500B is similar to the acoustic resonator 500A, except for formation of a bottom air-gap 515 and corresponding bottom support pillar 518 between the bottom electrode 110 and a bottom thin metal layer 553 formed between the bottom electrode 515 and the piezoelectric layer 130, instead of the top air-gap 545 and the corresponding top thin metal layer 551 between the piezoelectric layer 130 and the top electrode 540. Since there is no top thin metal layer 551, the top electrode 540' (defining the air-bridge 544) is formed directly on the top surface of the piezoelectric layer 130. The substrate 105 of the acoustic resonator 500B does not include a cavity (such as cavity 108 in FIG. 4A) because the air (or other gas(es) or vacuum, in certain configurations) in the bottom air-gap 515 will not transfer mechanical energy from the vibrating piezoelectric layer 130 to the bottom electrode 110, as discussed above. The formation and functionality of the bottom air-gap 515 is substantially the same as the bottom air-gap 315, discussed above with reference to FIG. 3C, and thus the description will not be repeated.

In addition, both the air-bridge 544 and an air-wing 546 are formed between the piezoelectric layer 130 and the top electrode 440'. The respective inner edges of the air-bridge 544 and the air-wing 546 define the outside boundaries of the main membrane region. The formation and functionality of the air-bridge 544 and the air-wing 546 are substantially the same as those of the air-bridge 244 and the air-wing 246, discussed above with reference to FIG. 2B, and thus the description will not be repeated.

The bottom thin metal layer 553 is formed after formation of the bottom air-gap 515 and prior to application of the piezoelectric layer 130. More particularly, as discussed above, the bottom air-gap 515 may be formed by applying the bottom support frame 124 on the substrate 105 and applying the bottom electrode 110 on the bottom support frame, such that the bottom electrode 110 defines the bottom air-gap 515 having dimensions corresponding to an opening in the bottom support frame 124. That is, the shape of the opening in the bottom support frame 124 is translated to the top surface of the bottom electrode 110, thus defining the bottom air-gap 515. The planarization layer 120 is formed on the bottom support frame 124 (indicated by a dashed line), adjacent to the bottom electrode 110. The bottom air-gap 515 may be filled with sacrificial material, such as PSG, and planarized along with the bottom electrode 110 and the planarization layer 120, using a CMP process, for example. The bottom electrode 110 and the sacrificial material may then be patterned and etched to remove material corresponding to the thickness of the subsequently applied bottom thin metal layer 553, and to provide a bottom air-gap pattern, where the etching removes portions of the sacrificial material to define an opening corresponding to the bottom support pillar 518. A metal layer is deposited on the bottom electrode 110 and the sacrificial material (after masking the planarization layer 120, for example) to provide the bottom thin metal layer 553, including the bottom support pillar 518 extending from the bottom thin metal layer 553. The piezoelectric layer 130 is formed on the top surfaces of the bottom thin metal layer 553 and the planarization layer 120, and the top electrode 540' (defining the air-bridge 544 and the air-wing 546) is formed on the top surface of the piezoelectric layer 130. At some point after formation of the bottom thin metal layer 553, the sacrificial material is released from the bottom air-gap 515.

Accordingly, the acoustic resonator 500B includes the substrate 105, the bottom electrode 110 disposed on the substrate 105 and the bottom support frame 124, the bottom thin metal layer 553 disposed on the bottom electrode 110 over the bottom air-gap 515 (including bottom support pillar 518 extending through the bottom air-gap 515), the planarization layer 120 disposed adjacent to bottom electrode 110 and the bottom thin metal layer 553 on the bottom support frame 124, the piezoelectric layer 130 disposed on the bottom thin metal layer 553 and the planarization layer 120, and the top electrode 540' disposed on the piezoelectric layer 130. Collectively, bottom electrode 110, the piezoelectric layer 130, and the top electrode 540 constitute an acoustic stack of acoustic resonator 500B, and an overlap among the bottom electrode 110, the bottom thin metal layer 553, the piezoelectric layer 130 and the top electrode 540' over the bottom air-gap 515 defines a main membrane region of the acoustic resonator 500B. The functionality and respective materials of various components of the acoustic resonator 500B are substantially the same as discussed above with reference to the acoustic resonator 100B.

Referring to FIG. 5C, acoustic resonator 500C is similar to the acoustic resonators 500A and 500B, except that it includes both top air-gap 545 and corresponding top support pillar 548 between the piezoelectric layer 130 and the top electrode 440, and bottom air-gap 515 and corresponding bottom support pillar 518 between the bottom electrode 110 and the piezoelectric layer 130. The acoustic resonator 500C also includes both the top thin metal layer 551 and the bottom thin metal layer 553, as well as the air-bridge 544 defined by the top electrode 540.

With regard to a regular FBAR (as opposed to a CCR, as disclosed herein), frames may be used to engineer the strength of Mason mode excitation at the acoustic resonator edge and improve the Q-factor in respective frequency ranges. With regard to a CCR, Mason mode excitation strength may be engineered by controlling height(s) of top and/or bottom air-gaps at the perimeter of the acoustic resonator. In general, the E-field excited acoustic motion amplitude of a piezoelectric layer (i.e., the amplitude of the acoustic displacement in vertical direction) is proportional to the applied voltage divided by the difference between the square of the E-field driving frequency F and the square of the series resonance frequency Fs (i.e., Voltage/($F^2-Fs^2$)). The addition of frames to an FBAR, for example, tends to move the series resonance frequency Fs away from the E-field driving frequency F in the corresponding perimeter (frame) region, thus reducing the acoustic displacement amplitude.

Figure 6A:
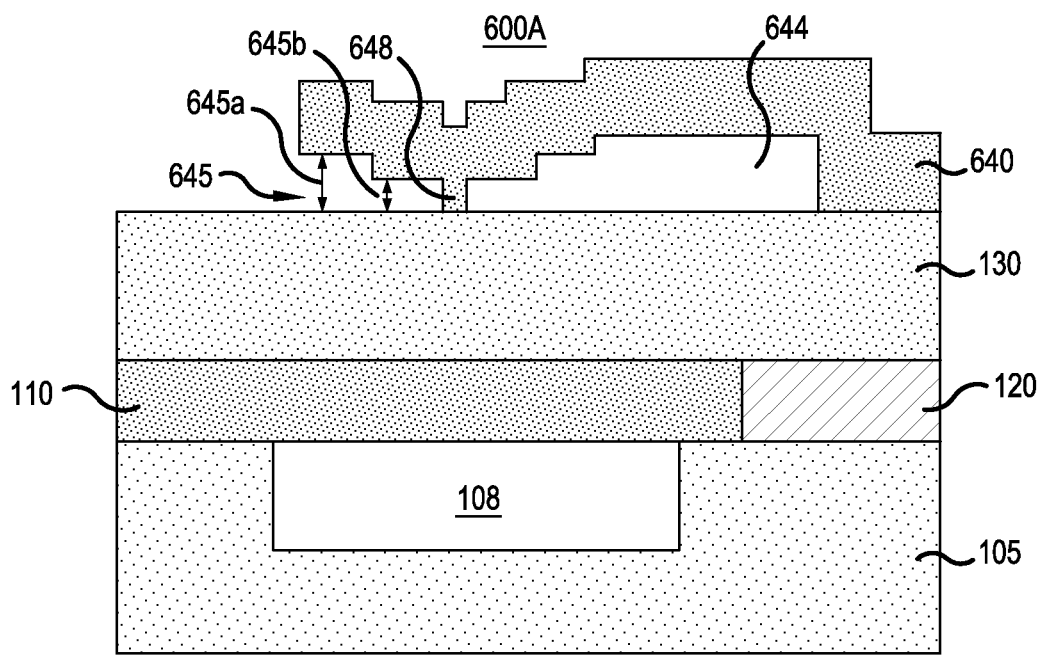
FIG. 6A is a cross-sectional view of an acoustic resonator according to a representative embodiment.
Figure 6B:
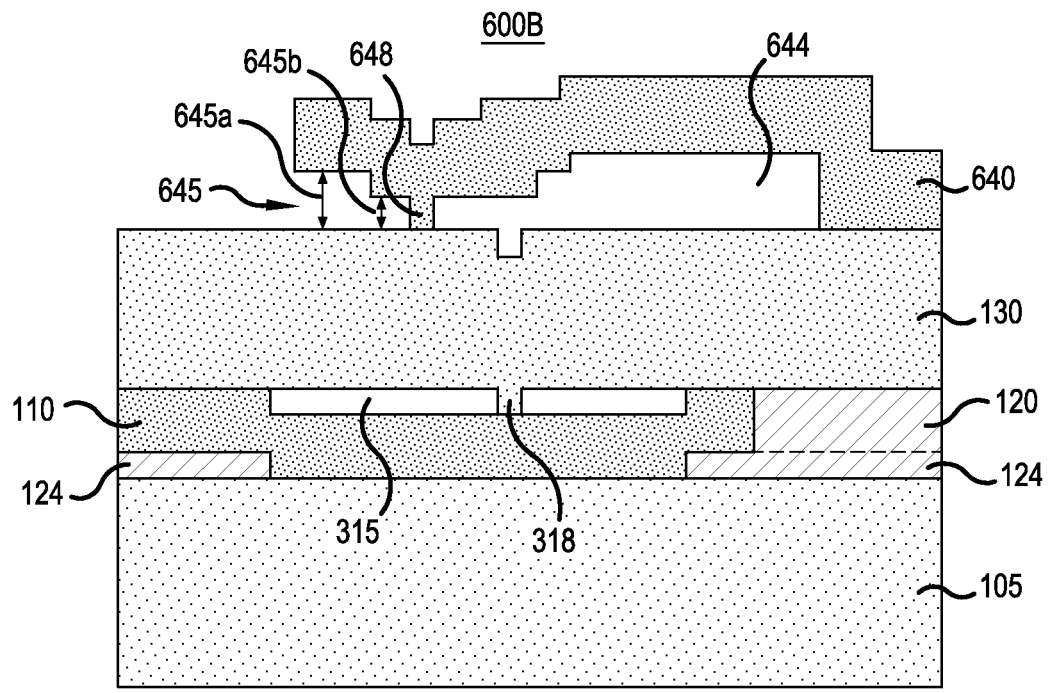
FIG. 6B is a cross-sectional view of an acoustic resonator according to a representative embodiment.
Figure 6C:
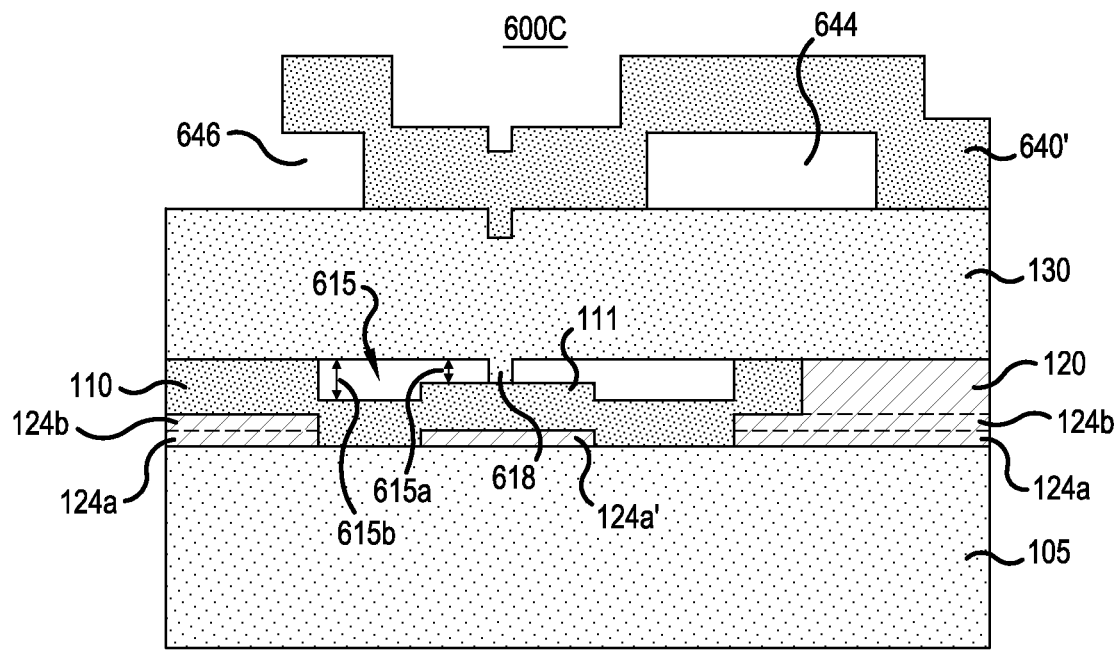
FIG. 6C is a cross-sectional view of an acoustic resonator according to a representative embodiment.

With regard to CCRs, since the dielectric constant of air is about ten times lower than that of piezoelectric materials, small changes or steps in the height of an air-gap in the CCR, as shown in FIGS. 6A-6C, for example, result in large changes in the effective voltage applied to the piezoelectric layer. Multiple air-gap heights can be produced relatively easily using multiple PSG layers along the perimeter of the acoustic resonator. In a CCR, the main source of parasitic mode excitation is E-field discontinuity at the top electrode edge. With multiple air-gap heights in one air-gap, a slow decay of E-field towards the electrode edge may be engineered, essentially eliminating spurious mode excitation, both above and below series resonance frequency Fs. In other words, increasing the height of an air-gap at the air-gap edge enables gradual lowering of the applied voltage along the perimeter, and therefore reduces the acoustic displacement amplitude along the perimeter edge in a fashion analogous to regular frames in standard FBARs. One beneficial difference between air-gap profiling in CCRs and frames in standard FBARs is that an increased air-gap along the perimeter of a CCR lowers the excited motion amplitude along the acoustic resonator's perimeter for all frequencies by the same fraction. Meanwhile, in standard FBARs thinner frames (than the main membrane thickness) are required to improve the performance below series resonance frequency Fs, and thicker frames (than the main membrane thickness) are required to improve the performance above series resonance frequency Fs.

FIGS. 6A-6C are cross-sectional diagrams illustrating acoustic resonators, having air-gaps with multiple heights and corresponding support pillars, and air-bridges and/or air-wings, according to representative embodiments.

Referring to FIG. 6A, acoustic resonator 600A comprises a substrate 105 defining a cavity 108, a bottom electrode 110 disposed on the substrate 105 over the cavity 108, a planarization layer 120 disposed adjacent to bottom electrode 110 on the substrate 105, a piezoelectric layer 130 disposed on the bottom electrode 110 and the planarization layer 120, and a top electrode 640 disposed on the piezoelectric layer 130. Collectively, the bottom electrode 110, the piezoelectric layer 130, and the top electrode 640 constitute an acoustic stack of acoustic resonator 600A, and an overlap among the bottom electrode 110, the piezoelectric layer 130 and the top electrode 640 over the cavity 108 defines a main membrane region of the acoustic resonator 600A. In addition, an air-bridge 644 is formed between the piezoelectric layer 130 and the top electrode 640, where an inner edge of the air-bridge 644 defines an outside boundary of the main membrane region. Although not shown, a passivation layer may be present on top of top electrode 640, as mentioned above.

A multiple height (or stepped) top air-gap 645 is formed between the piezoelectric layer 130 and the top electrode 640. As discussed above with reference to FIG. 3A, the top air-gap 645 is not supported by a top support frame, but rather by a top support pillar 648 formed in the top air-gap 645 to provide structural support between the piezoelectric layer 130 and the top electrode 640 in a region above the top air-gap 645. The top air-gap 645 has multiple heights, depicted as first height 645a at a center region of the top air-gap 645 and second height 645b at an edge region of the top air-gap 645 (or at a perimeter of the main membrane region of the acoustic resonator 600A). The second height 645b is higher than the first height 645a, resulting in reduction in acoustic displacement amplitude along the edge of the top air-gap 645, as discussed above. In various embodiments, additional heights (or steps) of the top air-gap 645, progressively increasing toward the edge of the top air-gap 645, may be incorporated without departing from the scope of the present teachings.

In the depicted embodiment, the top support pillar 648 is part of the material forming the top electrode 640, and may be formed in substantially the same manner as the top support pillar 348 of FIG. 3A, except that multiple layers of sacrificial material may be applied to increase the height of the top air-gap 645 (e.g., at the edge region). More particularly, multiple top air-gap layers may be sequentially deposited on the top surface of the piezoelectric layer 130, where each of the top air-gap layers is formed of a sacrificial material, such as PSG for subsequent wet release using hydro-fluoric acid (HF), for example. The multiple top air-gap layers may be patterned and etched to provide corresponding top air-gap patterns, where the etching removes portions of the top air-gap layers where the subsequently applied top electrode 640 contacts the piezoelectric layer 130 (e.g., the right side of the acoustic resonator 600A as shown in FIG. 6A) and defines vertically aligned openings corresponding to the top support pillar 648. The top electrode 640 may then be deposited on the exposed portion of the piezoelectric layer 130 and the top surface of the upper-most top air-gap pattern, where a portion of the material forming the top electrode 640 fills the vertically aligned openings in the layers of sacrificial material corresponding to the top support pillar 648. The layers of sacrificial material are released, leaving the top air-gap 645 with steps corresponding to first and second heights 645a and 645b and the top support pillar 648, such that the top support pillar 648 comprises material of the top electrode 640 extending through the narrower portion of the top air-gap 645 and contacting the piezoelectric layer 130.

Referring to FIG. 6B, acoustic resonator 600B is similar to the acoustic resonator 600A, except for formation of a bottom air-gap 315 and corresponding bottom support pillar 318 between the bottom electrode 110 and the piezoelectric layer 130, in addition to the top air-gap 645 and the corresponding top support pillar 648 between the piezoelectric layer 130 and the top electrode 640. Also, the substrate 105 of the acoustic resonator 600B does not include a cavity (such as cavity 108 in FIG. 6A). The formation and functionality of the bottom air-gap 315 and the corresponding bottom support pillar 318 are substantially the same as discussed above with reference to FIG. 3B, and thus the description will not be repeated.

Accordingly, the acoustic resonator 600B includes the substrate 105, the bottom electrode 110 disposed on the substrate 105 and the bottom support frame 124, the planarization layer 120 disposed adjacent to bottom electrode 110 on the bottom support frame 124, the piezoelectric layer 130 disposed on the bottom electrode 110 and the planarization layer 120, and the top electrode 640 disposed on the piezoelectric layer 130. Collectively, bottom electrode 110, the piezoelectric layer 130, and the top electrode 640 constitute an acoustic stack of acoustic resonator 600B, and an overlap among the bottom electrode 110, the piezoelectric layer 130 and the top electrode 640 over the bottom air-gap 315 defines a main membrane region. As discussed above, because the acoustic resonator 600B includes the bottom air-gap 315, there is no need for a cavity (such as cavity 108 in FIG. 6A) formed in the substrate 105 or a DBR formed on the substrate 105. The functionality and respective materials of various components of the acoustic resonator 600B are substantially the same as discussed above with reference to the acoustic resonator 100B.

Referring to FIG. 6C, acoustic resonator 600C is similar to the acoustic resonator 600B, except that it includes a multiple height (or stepped) bottom air-gap 615 and corresponding bottom support pillar 618 between the bottom electrode 110 and the piezoelectric layer 130, as opposed to the bottom air-gap 315 and the corresponding bottom support pillar 318. In the depicted embodiment, the acoustic resonator 600C includes air-bridge 644 and air-wing 646 formed between the piezoelectric layer 130 and the top electrode 640', but does not include multiple height top air-gap 645 and corresponding top support pillar 648. However, in alternative embodiments, the multiple height top air-gap 645 and the corresponding top support pillar 648 may be included in an acoustic resonator along with the multiple height bottom air-gap 615, without departing from the scope of the present teachings.

In the depicted embodiment, the multiple heights (or steps) of the bottom air-gap 615 is enabled by a raised center portion 111 of the bottom electrode 110, which provides for thicker air-gaps on either side of the raised center portion 111. That is, the bottom air-gap 615 has multiple heights, depicted as first height 615a at a center region of the bottom air-gap 615 (corresponding to the raised center portion 111) and second height 615b at an edge region of the bottom air-gap 615 (or at a perimeter of the main membrane region of the acoustic resonator 600A). The second height 615b is higher than the first height 615a, resulting in reduction in acoustic displacement amplitude along the edge of the bottom air-gap 615, as discussed above. In various embodiments, additional heights (or steps) of the bottom air-gap 615, progressively increasing toward the edge of the bottom air-gap 615, may be incorporated without departing from the scope of the present teachings.

More particularly, the bottom air-gap 615 may be formed by applying a first bottom support layer (corresponding to a first bottom support frame 124a) on the substrate 105 and a second bottom support layer (corresponding to a second bottom support frame 124b) on the first bottom support layer, indicated by a dashed line. The stacked first and second bottom support layers are patterned and etched in two steps. The first step removes a center portion of the second bottom support layer to provide the second bottom support frame 124b, which defines an opening corresponding to the outer edges of the bottom air-gap 615. The second step removes portions of the first bottom support layer surrounding a center portion thereof to provide the first bottom support frame 124a. The first bottom support frame 124a also defines the opening corresponding to the outer edges of the bottom air-gap 615, and further provides a center portion 124a' corresponding to the raised center portion 111 of the bottom electrode 110. The material forming the bottom electrode 110 is then applied on the first and second bottom support frames 124a and 124b and a portion of the substrate 105 exposed through the opening of the first and second bottom support frames 124a and 124b, such that the resulting bottom electrode 110 defines the bottom air-gap 615. That is, the shape of the outer edges of the opening in the first and second bottom support frames 124a and 124b is translated to the top surface of the bottom electrode 110, thus defining the outer edges of the bottom air-gap 615, and the shape of the center portion 124a' is translated to the top surface of the bottom electrode 110 as the raised center portion 111.

The planarization layer 120 is formed on the second bottom support frame 124b (indicated by another dashed line), adjacent to the bottom electrode 110. A bottom air-gap layer may be deposited on top surfaces of the bottom electrode 110 and the planarization layer 120, where the bottom air-gap layer is formed of a sacrificial material, such as PSG, for subsequent wet release. The bottom air-gap layer may then be patterned and etched to provide a bottom air-gap pattern, where the etching removes portions of the bottom air-gap layer from the bottom electrode 110 and the planarization layer 120, and defines an opening corresponding to the bottom support pillar 618 in the sacrificial material filling the bottom air-gap 615. The bottom electrode 110, the planarization layer 120, and the sacrificial material are planarized, using a CMP process, for example. The piezoelectric layer 130 may then be deposited on the planarized top surfaces of the bottom electrode 110, the planarization layer 120, and the sacrificial material, where a portion of the material forming the piezoelectric layer 130 fills the opening in the sacrificial material corresponding to the bottom support pillar 618. The top electrode 640' (defining the air-bridge 644 and the air-wing 646) is formed on the top surface of the piezoelectric layer 130. At some point after formation of the piezoelectric layer 130, the sacrificial material is released, leaving the bottom air-gap 615 with steps corresponding to first and second heights 615a and 615b and the bottom support pillar 618, such that the bottom support pillar 618 comprises material of the piezoelectric layer 130 extending through the narrower portion of the bottom air-gap 615 and contacting the bottom electrode 110.

Accordingly, the acoustic resonator 600C includes the substrate 105, the bottom electrode 110 disposed on the substrate 105 and the first and second bottom support frames 124a and 124b, the planarization layer 120 disposed adjacent to bottom electrode 110 on the second bottom support frame 124b, the piezoelectric layer 130 disposed on the bottom electrode 110 and the planarization layer 120, and the top electrode 640' disposed on the piezoelectric layer 130. Collectively, bottom electrode 110, the piezoelectric layer 130, and the top electrode 640' constitute an acoustic stack of acoustic resonator 600C, and an overlap among the bottom electrode 110, the piezoelectric layer 130 and the top electrode 640' over the bottom air-gap 615 defines a main membrane region. As discussed above, because the acoustic resonator 600C includes the bottom air-gap 615, there is no need for a cavity (such as cavity 108 in FIG. 6A) formed in the substrate 105 or a DBR formed on the substrate 105. The functionality and respective materials of various components of the acoustic resonator 600C are substantially the same as discussed above with reference to the acoustic resonator 100B.

FIGS. 7A-7D are top views of air-gap regions having various numbers and arrangements of support pillars according to representative embodiments. The air-gap regions 771-774 may correspond to regions of any of the patterned top or bottom air-gaps discussed above. Likewise, the support pillar(s) 778 may correspond to any of the support pillars in the top or bottom air-gaps discussed above.

Figure 7A:
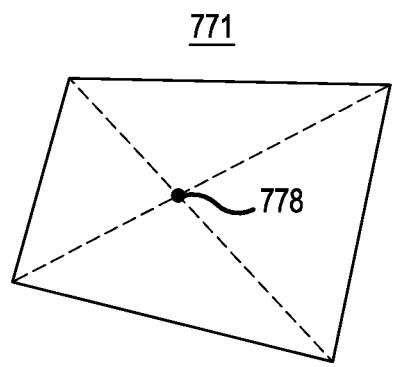
FIG. 7A is a top view of an air-gap region having one support pillar according to a representative embodiment.
Figure 7C:
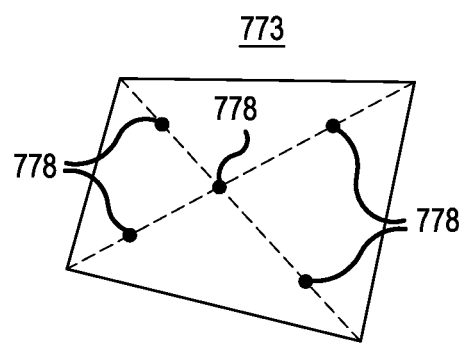
FIG. 7C is a top view of an air-gap region having five support pillars according to a representative embodiment.
Figure 7B:
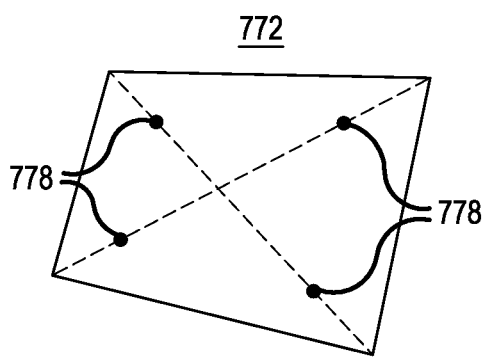
FIG. 7B is a top view of an air-gap region having four support pillars according to a representative embodiment.
Figure 7D:
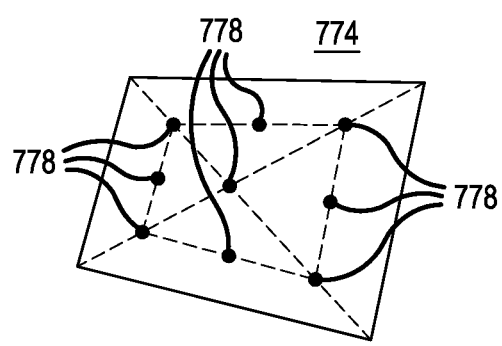
FIG. 7D is a top view of an air-gap region having nine support pillars according to a representative embodiment.

FIG. 7A shows air-gap region 771 having a single support pillar 778, located at substantially the center of the air-gap region 771. Examples of this configuration are shown in FIG. 3C, in which a single top support pillar 348 is provided in about the center of the top air-gap 345, and a single bottom support pillar 318 is provided in about the center of the bottom air-gap 315. FIG. 7B shows air-gap region 772 having four support pillars 778, each located about one third of the distance between the corresponding pattern corner (that defines the air-gap) and the center point of the air-gap region 772, although other fractional distances may be incorporated. FIG. 7C shows air-gap region 773 having five support pillars 778, effectively combining the locations of the support pillars 778 shown in FIGS. 7A and 7B. FIG. 7D shows air-gap region 774 having nine support pillars 778, arranged substantially symmetrically in three rows and three columns, including one support pillar 778 at the center point of the air-gap region 774.

Generally, as mentioned above, increasing the number support pillars 778 increases robustness of the structure, but also increases scattering at the edges of the support pillars 778. In addition, although the support pillar(s) 778 in FIGS. 7A-7D have circular cross-sections, the cross-sectional shapes may vary. For example, the cross-sectional shapes of the support pillar(s) 778 may be square, rectangular, oval, triangular, or any other shape. Also, when there is more than one, the support pillars 778 may have the same or different shapes from one another. Of course, the number, size, shape and arrangement of the support pillar(s) 778 may vary to provide unique benefits for any particular situation or to meet application specific design requirements of various implementations, as would be apparent to one skilled in the art.

Generally, thin air-gaps and corresponding support structures may be placed in various alternative locations and configurations above and/or below the piezoelectric layer of an acoustic resonator to provide various CCR devices. Likewise, air-bridges and/or air-wings may be included in various alternative locations and configurations. The respective dimensions, materials, relative positioning, and so on, can be adjusted to achieve specific design objectives, such as a target resonant frequency, series resistance Rs, parallel resistance Rp, or electromechanical coupling coefficient $Kt^2$. Although the above description presents several embodiments in the form of FBAR devices, several of the described concepts could be implemented in other forms of acoustic resonators, such as SMRs, for example.

While example embodiments are disclosed herein, one of ordinary skill in the art appreciates that many variations that are in accordance with the present teachings are possible and remain within the scope of the appended claims. For instance, as indicated above, the location, dimensions, materials and even numbers of frames can be variously altered. In addition, other features can be added and/or removed to further improve various performance characteristics of the described devices. These and other variations would become clear to one of ordinary skill in the art after inspection of the specification, drawings and claims herein. The invention therefore is not to be restricted except within the spirit and scope of the appended claims.

The invention claimed is:

1. A bulk acoustic wave (BAW) resonator, comprising:
a bottom electrode disposed on a substrate;
a piezoelectric layer disposed over the bottom electrode;
a top electrode disposed over the piezoelectric layer; and
a top air-gap and corresponding top support structure separating the top electrode from the piezoelectric layer, wherein the corresponding top support structure is located within the top air-gap between the top electrode and the piezoelectric layer.

2. The BAW resonator of claim 1, wherein the top air-gap has a height less than or equal to approximately 500 Å.

3. The BAW resonator of claim 1, wherein a main membrane region of the BAW resonator is defined by overlapping portions of the bottom electrode, the piezoelectric layer, the top electrode, and the top air-gap.

4. The BAW resonator of claim 1, further comprising:
a cavity formed in the substrate,
wherein the bottom electrode is formed on a top surface of the substrate over the cavity.

5. The BAW resonator of claim 1, wherein the corresponding top support structure comprises a support pillar formed in the top air-gap to provide structural support to the top electrode.

6. The BAW resonator of claim 1, further comprising:
a bottom air-gap and corresponding bottom support structure separating the bottom electrode from the piezoelectric layer.

7. The BAW resonator of claim 6, wherein the top and bottom air-gaps have approximately the same heights.

8. A bulk acoustic wave (BAW) resonator, comprising:
a bottom electrode disposed on a substrate;
a piezoelectric layer disposed over the bottom electrode;
a top electrode disposed over the piezoelectric layer; and
at least one air-gap and corresponding support structure, the at least one air-gap separating at least one of the bottom electrode and the top electrode from the piezoelectric layer, respectively, and the corresponding support structure comprising a support frame defining an opening corresponding to the at least one air-gap, wherein the at least one of the bottom electrode and the top electrode is formed on the support frame.

9. A bulk acoustic wave (BAW) resonator, comprising:
a bottom electrode disposed on a substrate;
a piezoelectric layer disposed over the bottom electrode;
a top electrode disposed over the piezoelectric layer; and
at least one support pillar formed in a bottom air-gap, and configured to maintain a height of the bottom air-gap,
wherein the bottom electrode is separated from the piezoelectric layer by the bottom air-gap and supported by the at least one support pillar, and the top electrode is formed on a top surface of the piezoelectric layer.

10. The BAW resonator of claim 9, further comprising:
an air-bridge and an air-wing formed between the piezoelectric layer and the top electrode.

11. A bulk acoustic wave (BAW), comprising:
a bottom electrode disposed on a substrate;
a piezoelectric layer disposed over the bottom electrode;
a top electrode disposed over the piezoelectric layer; and
at least one support pillar formed in at least one of a bottom air-gap and a top air-gap, and configured to maintain a height of the corresponding at least one of the bottom air-gap and the top air-gap,
wherein at least one of the bottom electrode and the top electrode is separated from the piezoelectric layer by a corresponding at least one of the bottom air-gap and the top air-gap, respectively, and is supported by the at least one support pillar,
wherein the at least one of the bottom air-gap and the top air-gap is a multiple height air-gap comprising at least a first height at a center region and second height at an edge region of the corresponding at least one of the bottom air-gap and the top air-gap, and
wherein the first height is less than the second height of each of the at least one multiple height air-gaps.

12. The BAW resonator of claim 11, further comprising:
a cavity formed in the substrate,
wherein the top electrode is separated from the piezoelectric layer by the corresponding top air-gap and supported by the at least one support pillar, and the bottom electrode is formed on a top surface of the substrate over the cavity.

13. The BAW resonator of claim 11, wherein both the top electrode and the bottom electrode are separated from the piezoelectric layer by the top air-gap and the bottom air-gap, respectively, and are supported by at least one top support pillar and at least one bottom support pillar, respectively.

14. The BAW resonator of claim 13, wherein the at least one of the bottom electrode and the top electrode separated from the piezoelectric layer by the corresponding at least one of the bottom air-gap and the top air-gap, respectively, is supported by a plurality of support pillars.

15. A bulk acoustic wave (BAW) resonator, comprising:
a bottom electrode disposed on a substrate;
a piezoelectric layer disposed over the bottom electrode;
a top electrode disposed over the piezoelectric layer; and
at least one thin metal layer formed adjacent the piezoelectric layer,
wherein at least one of the bottom electrode and the top electrode is separated from the at least one thin metal layer by a corresponding at least one of a bottom air-gap and a top air-gap, respectively.

16. The BAW resonator of claim 15, further comprising:
a plurality of support pillars formed in the at least one of the bottom air-gap and the top air-gap, the plurality of support pillars electrically shorting the at least one thin metal layer, thereby reducing voltage drop across the air-gap and increasing electromechanical coupling coefficient $Kt^2$.

17. The BAW resonator of claim 15, wherein both the top electrode and the bottom electrode are separated from the piezoelectric layer by the top air-gap and the bottom air-gap, respectively, and are supported by at least one top support pillar and at least one bottom support pillar, respectively.

* * * * *